(12) United States Patent
Henley

(10) Patent No.: US 8,110,480 B2
(45) Date of Patent: *Feb. 7, 2012

(54) METHOD AND STRUCTURE FOR FABRICATING SOLAR CELLS USING A THICK LAYER TRANSFER PROCESS

(75) Inventor: Francois J. Henley, Aptos, CA (US)

(73) Assignee: Silicon Genesis Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/730,113

(22) Filed: Mar. 23, 2010

(65) Prior Publication Data

US 2010/0178723 A1    Jul. 15, 2010

Related U.S. Application Data

(63) Continuation of application No. 11/852,088, filed on Sep. 7, 2007, now Pat. No. 7,811,900.

(60) Provisional application No. 60/825,095, filed on Sep. 8, 2006.

(51) Int. Cl.
*H01L 21/30* (2006.01)

(52) U.S. Cl. ............... 438/458; 438/459; 438/464
(58) Field of Classification Search ............ 438/57, 438/68, 149, 150, 162, 455, 458, 459, 464
See application file for complete search history.

(56) References Cited

U.S. PATENT DOCUMENTS

| 6,013,563 | A  | * | 1/2000  | Henley et al. | 438/458 |
| 7,811,900 | B2 | * | 10/2010 | Henley | 438/458 |
| 2002/0064924 | A1 | * | 5/2002 | Cheung et al. | 438/400 |
| 2008/0179547 | A1 | * | 7/2008 | Henley | 250/492.21 |

* cited by examiner

*Primary Examiner* — Kevin M Picardat
(74) *Attorney, Agent, or Firm* — Kilpatrick Townsend and Stockton LLP

(57) ABSTRACT

A photovoltaic cell device, e.g., solar cell, solar panel, and method of manufacture. The device has an optically transparent substrate comprises a first surface and a second surface. A first thickness of material (e.g., semiconductor material, single crystal material) having a first surface region and a second surface region is included. In a preferred embodiment, the surface region is overlying the first surface of the optically transparent substrate. The device has an optical coupling material provided between the first surface region of the thickness of material and the first surface of the optically transparent material.

26 Claims, 22 Drawing Sheets

Glass Substrate

METHOD AND STRUCTURE FOR FABRICATING SOLAR CELLS USING A THICK LAYER TRANSFER PROCESS

CROSS-REFERENCES TO RELATED APPLICATIONS

The instant nonprovisional application is a continuation of U.S. patent application Ser. No. 11/852,088, filed Sep. 7, 2007, which claims priority to U.S. Provisional Patent Application No. 60/825,095, filed Sep. 8, 2006, which are incorporated by reference in their entirety herein for all purposes.

BACKGROUND OF THE INVENTION

Embodiments in accordance with the present invention relate generally to techniques including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

From the beginning of time, human beings have relied upon the "sun" to derive almost all useful forms of energy. Such energy comes from petroleum, radiant, wood, and various forms of thermal energy. As merely an example, human being have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon and/or single crystal silicon materials. These materials are often difficult to manufacture. Polysilicon cells are often formed by manufacturing polysilicon plates. Although these plates may be formed effectively, they do not possess optimum properties for highly effective solar cells. Single crystal silicon has suitable properties for high grade solar cells. Such single crystal silicon is, however, expensive and is also difficult to use for solar applications in an efficient and cost effective manner. Generally, thin-film solar cells are less expensive by using less silicon material but their amorphous or polycrystal structure are less efficient than the more expensive bulk silicon cells made from single-crystal silicon substrates. These and other limitations can be found throughout the present specification and more particularly below.

From the above, it is seen that a technique for manufacturing large substrates which is cost effective and efficient is desirable.

BRIEF SUMMARY OF THE INVENTION

According to embodiments of the present invention, techniques directed to the manufacture of photovoltaic materials are provided. More particularly, the invention provides a technique including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

In a specific embodiment, the present invention provides a method for fabricating a photovoltaic cell, e.g., solar cell, solar panel. The method includes providing a semiconductor substrate, which has a surface region, a cleave region and a first thickness of material to be removed between the surface region and the cleave region. The method includes coupling the surface region of the semiconductor substrate to a first surface region of an optically transparent substrate, e.g., glass, quartz, plastic. In a preferred embodiment, the optically transparent substrate comprises the first surface region and a second surface region. The method also includes cleaving the semiconductor substrate to remove the first thickness of material from the semiconductor substrate, while the surface region remains coupled to the first surface region, to cause formation of a cleaved surface region. For example, in photovoltaic applications, the first thickness of material transferred may be used as a light absorber layer if the first thickness of material has a sufficient thickness. Depending on the thickness of the first thickness of material, the first thickness of material can be sufficient for effective thin-film solar cells. In certain embodiments, the first thickness of material may be thick enough as a cost-effective replacement for thick substrates made using conventional methods such as sawing and wafering processes. Thinner thicknesses of material can also be used as a single crystal template for a subsequent epitaxial growth process. Optionally, the method includes forming a second thickness of semiconductor material overlying the cleaved surface region to form a resulting thickness of semiconductor material.

In an alternative specific embodiment, the present invention provides a photovoltaic cell device, e.g., solar cell, solar panel. The device has an optically transparent substrate comprises a first surface and a second surface. A first thickness of material (e.g., semiconductor material, single crystal material) having a first surface region and a second surface region is included. In a preferred embodiment, the surface region is overlying the first surface of the optically transparent substrate. The device has an optical coupling material (e.g., Tin Oxide, Indium Tin Oxide (ITO), Titanium Dioxide, Zinc Oxide (ZnO), or other dielectric stack formation material, spin on glass (SOG), or other suitable materials) provided between the first surface region of the thickness of material and the first surface of the optically transparent material.

In yet an alternative specific embodiment, the present invention provides a multi-pass method and structure. That is, the present structure has a reflective surface that redirects light back into active regions of one or more photovoltaic regions. In a specific embodiment, light traverses through a glass substrate and a photovoltaic region, which converts light into electrical power. Any light traversing through the photovoltaic region is then reflected back via a reflecting surface to one or more portions of the photovoltaic region. Of course, there can be other variations, modifications, and alternatives.

In yet other alternatives according to embodiments of the present invention, the present method and structure provides one or more light trapping structures such as a plastic Fresnel sheet on the backside of the glass or some other material that would scatter/redirect the light to more oblique angles and thus increase collection efficiency in a thin cell. Of course, there can be other variations, modifications, and alternatives.

Other embodiments of structures and methods in accordance with the present invention may feature light trapping using surface texturization etches on one or both surfaces of the absorber made using the cleaved material. Specific etch formulations are designed according to the specific material used (i.e. crystal orientation, single-crystal or multi-crystalline, etc.) to maximize the ability for the absorber/surface configuration to approach a lambertian surface in its ability to absorb incoming light. For example, weakly faceting etches may optimize a (110) crystal orientation, while a highly faceting etch (for example using KOH) could optimize a (100) crystal configuration. Of course, there can be other variations, modifications, and alternatives.

Numerous benefits are achieved over pre-existing techniques using the present invention. In particular, the present invention uses controlled energy and selected conditions to preferentially cleave a thin photovoltaic film onto a glass substrate according to a specific embodiment. In a specific embodiment, the present method and device provides a very high quality photovoltaic material on glass, which can be used as a portion of the packaging material. In a preferred embodiment, the present method and structure provide for single crystal silicon for providing efficient power using photovoltaic cells. In a specific embodiment, the present invention provides a layer transfer of a thick single crystal silicon material, which would be used for manufacture of photovoltaic regions. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

Figure 1:
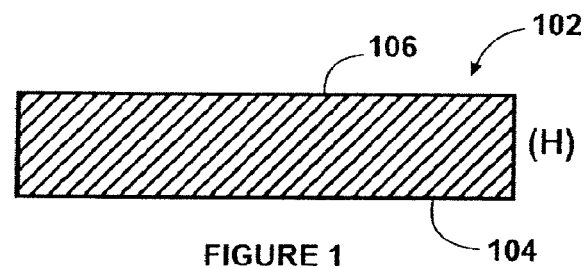
FIGS. 1 through 15 illustrate a method for fabricating a photovoltaic device according to an embodiment of the present invention.

According to embodiments of the present invention, techniques directed to the manufacture of photovoltaic materials are provided. More particularly, the invention provides a technique including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

A method of manufacturing a photovoltaic layer on a semiconductor substrate is briefly outlined below.

1. Provide a semiconductor substrate, which has a surface region characterized by a tile configuration, a cleave region and a first thickness of material to be removed between the surface region and the cleave region;

2. Align the semiconductor substrate to an optically transparent substrate;

3. Couple the surface region of the semiconductor substrate to a first surface region of the optically transparent substrate;

4. Initiate a controlled cleaving action on a portion of the cleave region;

5. Cleave the semiconductor substrate to remove the first thickness of material from the semiconductor substrate, while the surface region remains coupled to the first surface region, to cause formation of a cleaved surface region; and 6. Optionally, form a second thickness of semiconductor material overlying the cleaved surface region to form a resulting thickness of semiconductor material, which has one or more photovoltaic regions;

7. Form a solar cell from at least the first thickness of material and the optically transparent material; and 8. Perform other steps, as desired.

The above sequence of steps provides a method according to an embodiment of the present invention. As shown, the technique includes a method and a structure for forming a solar cell structure using layer transfer techniques for photovoltaic applications.

Other alternatives can also be provided where steps are added, one or more steps are removed, or one or more steps are provided in a different sequence without departing from the scope of the claims herein. For example, in accordance with an alternative embodiment, steps 4 and 5 above can be performed in the reverse order, such that cleaving occurs first, followed by moving the cleaved film onto a transparent substrate.

Alternatively, there can be other ways of forming the structure. That is, the sequence can initially be formed on a cover sheet such as cover glass and other suitable materials and then forming the other layers according to a specific embodiment. The layer transfer occurs on the cover glass, which is used to form the rest of the solar cell device. Other techniques can use transfer substrates that will transfer a layer transferred material onto a handle substrate. Further details of the present method can be found throughout the present specification and more particularly below.

As shown in FIG. 1, the method provides a transparent handle substrate 102, which has a first deflection characteristic, a backside 104, and a face 106. The transparent handle substrate can be glass, quartz, polymeric, or other composites, and the like. As merely an example, the transparent substrate has a thickness, a backside surface, and a face. The transparent substrate is glass, such as those used for covering solar cells or the like. Depending upon the embodiment, the glass is somewhat flexible and should be subjected to a backing plate for rigidity. Of course, there can be other variations, modifications, and alternatives.

Figure 2:
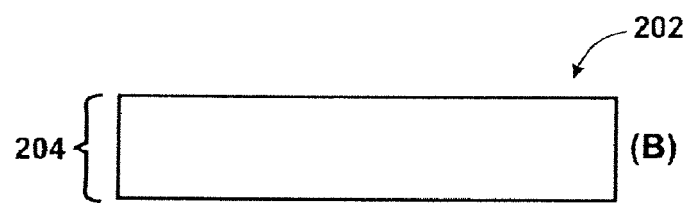

In alternative embodiments, the handle substrate can be any homogeneous, graded, or multilayered material, or any combination of these. That is, the handle substrate can be made of almost any monocrystalline, polycrystalline, or even amorphous type substrate. The substrate can be made of SiC. Additionally, the substrate can be made of III/V materials such as gallium arsenide, gallium nitride (GaN), and others. Additionally, the substrate can be silicon carbide, germanium, silicon, glass or quartz combinations, plastics, and polymers, which have flexible characteristics. Preferably, the handle substrate has a somewhat flexible characteristic that is unsuitable for a layer transfer process according to a specific embodiment. The unsuitable nature of the substrate causes excessive roughness, breakage, partial film separation, and the like depending upon the specific embodiment. Any other combinations of materials can also be used, depending upon the specific embodiment In a preferred embodiment, the present invention provides a backing substrate 202 to add rigidity to handle substrate structure, as shown in FIG. 2. Preferably, the backing substrate has a thickness 204 and material that is adequate to provide an effective deflection characteristic of a multilayered structure composed of at least the backing substrate and handle substrates to be suitable for a thickness of silicon bearing material from the donor substrate to be transferred onto the face of the handle substrate.

As merely an example, the backing substrate is a silicon wafer for the quartz handle substrate. Such backing substrate has a thickness of 725 microns +/−15 microns and is made of single crystal silicon using, for example, a 200 millimeter donor/handle/backing substrate structures. Such substrate has a Young's modulus of about 130 Giga Pascal in a <100> direction. Other types of materials and certain thicknesses such as plastic, metal, glass, quartz, composites, and the like can be used to provide the rigidity to the combined backing and handle substrate structures. Of course, one of ordinary skill in the art would recognize other variations, modifications, and alternatives.

Figures 3, 4:
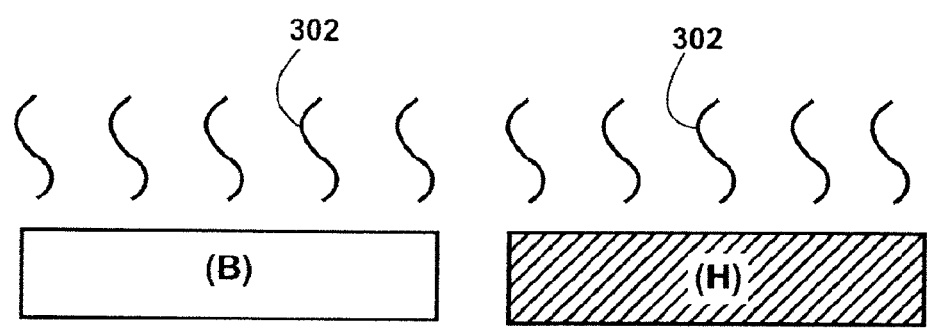

In an optional specific embodiment, the method performs a cleaning and/or activating process 302 (e.g., plasma activated process) on surfaces of the backing and/or transparent handle substrates, as illustrated by FIGS. 3 and 4. Such plasma activating processes clean and/or activate the surfaces of the substrates. The plasma activated processes are provided using an oxygen or nitrogen bearing plasma at 20° C.-40° C. temperature. The plasma activated processes are preferably carried out in dual frequency plasma activation system manufactured by Silicon Genesis Corporation of San Jose, Calif. In still other embodiments, there may not be any backing material. Alternatively in still further embodiments, the present method can use a backing material by way of an electrostatic chuck and/or a porous chuck, and the like. Depending upon the specific embodiment, the present backing material can be provided on either the handle or donor substrate or both the handle and donor substrates. Of course, there can be other variations, modifications, and alternatives.

Figure 5:
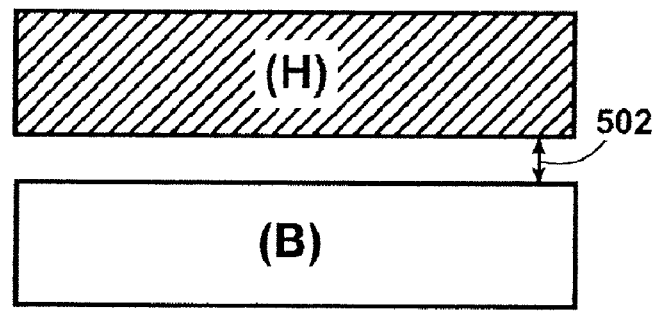
Figure 6:
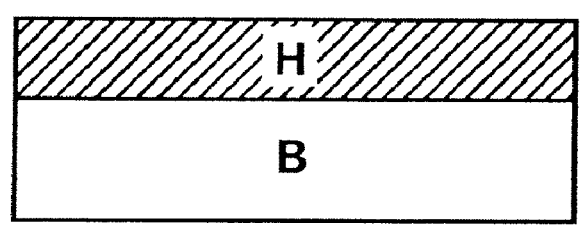

Referring to FIG. 5, the method initiates engagement 502 of the backing substrate to the backside of the transparent handle substrate that is often physically separated from other structures. The method preferably temporarily attaches the backing substrate to the backside of the transparent handle substrate to firmly engage the backing substrate to the transparent handle substrate to form a multilayered structure. As merely an example, the silicon wafer backing substrate firmly attaches to the quartz plate without any other modifications and/or alterations according to a preferred embodiment. Here, the silicon wafer has a very thin coating of native oxide, which bonds to surfaces of the quartz plate, although there may be embodiments without such native oxide, as shown in FIG. 6. In other embodiments, bonding can occur using an electrostatic process or web bonding, including covalent bonding, any combination of these and the like. In yet alternative embodiments, the bonding can also occur using a spin on glass, glue layer, any combination of these, and the like. Of course, there can be other variations, modifications, and alternatives.

Figure 7:
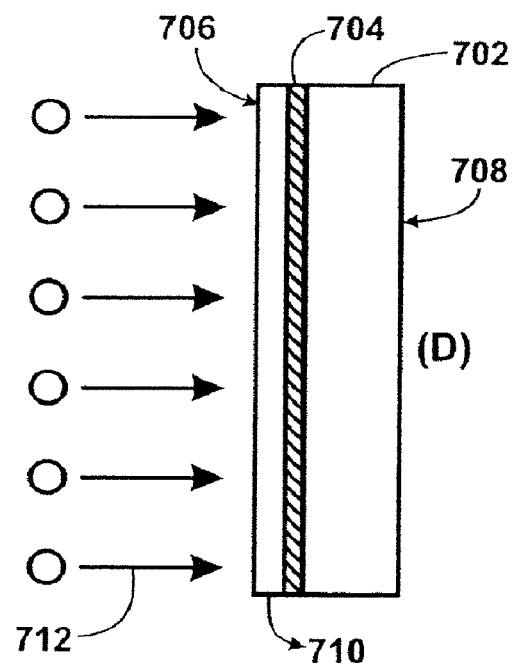

As shown, the method includes providing a donor substrate 702 comprising a cleave region 704, a face 706, a backside 708, and a thickness of silicon bearing material 710 between the face and the cleave region, as shown in FIG. 7. As merely an example, the donor substrate can be a silicon wafer, GaN, a germanium wafer, silicon germanium materials, silicon carbide bearing materials, Group III/V compounds, any combination of these, and others. In a preferred embodiment, the donor substrate can be a photosensitive material. Of course there can be other variations, modifications, and alternatives.

The type of material selected for the donor substrate may depend upon a particular application. For example, where the donor substrate comprises single crystal silicon material, the orientation of the surface may be selected to be (100), (110), or (111). Alternatively, these surfaces can be said to have a normal to surface direction in the <100>, <110>, and <111> direction respectively where the term "direction" refers to this normal to surface terminology unless specifically described otherwise. A single crystal silicon substrate having a (100) surface orientation is a more commonly grown orientation in certain industries such as the solar cell industry, however this orientation has planes that can be more susceptible to unwanted out-of-plane cracking extending into the substrate during the cleaving process.

For purposes of the instant application, out of plane cracking refers to cleave failure mechanisms where the propagating cleave direction moves away from the desired cleave plane. One such mechanism is called "branching" where the cleave plane shifts to another major crystal orientation such as (111). Another cleave failure mechanism is the undesirable change in direction, roughness or depth of the propagating cleave caused by shear stresses. These cleave failures are to be avoided using a selection of appropriate starting material orientation coupled with appropriate implant and cleaving techniques as are taught in this application.

By contrast to a single crystal silicon substrate having a (100) surface orientation, a single crystal silicon substrate having a (110) surface orientation may have different getter site and defect region interactions with the implant particles. With hydrogen as the implant specie for example, (110) surface orientation has slower hydrogen detrapping and a higher cleave layer compressive stress profile. However, single crystal silicon (110) are cleaving planes that propagate with less potential of branching than (100) and can desirably result in less out-of-plane cracking extending into the substrate during the cleaving process.

Figure 28A:
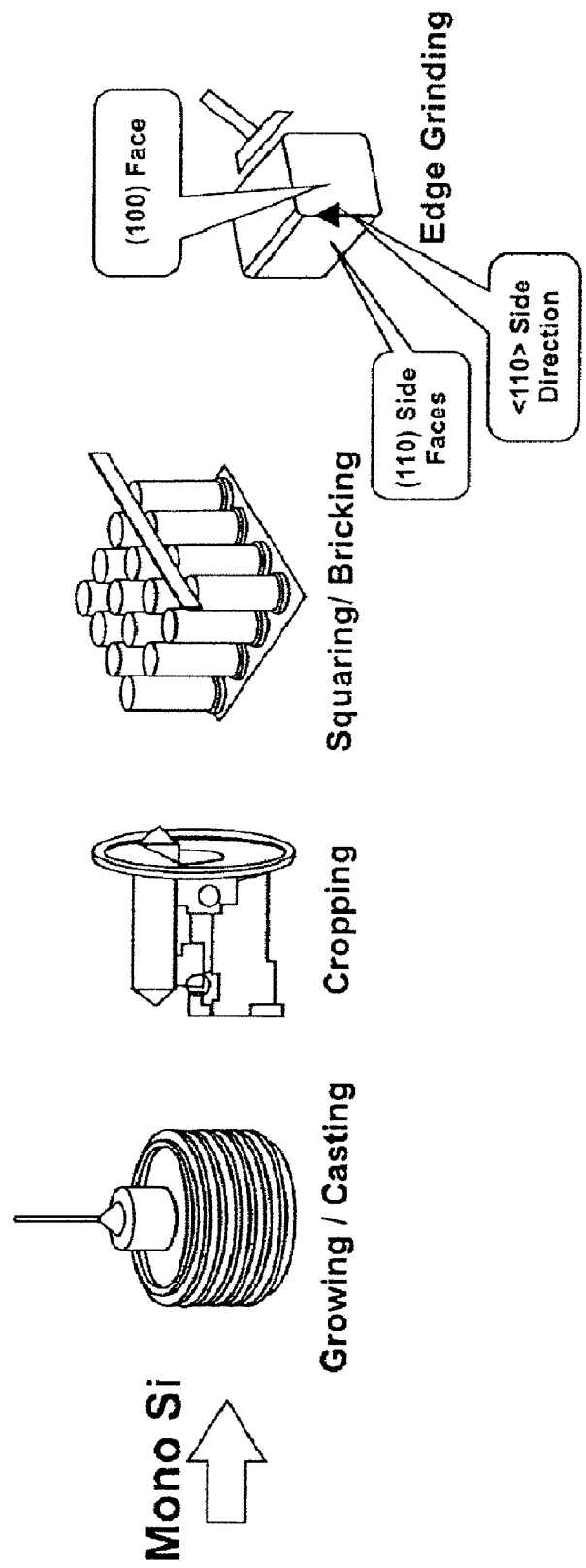
FIGS. 28A-C show views of a process of forming an ingot having a face with a surface orientation of (110) from a boule grown with a face having a surface orientation of (100).
Figure 28B:
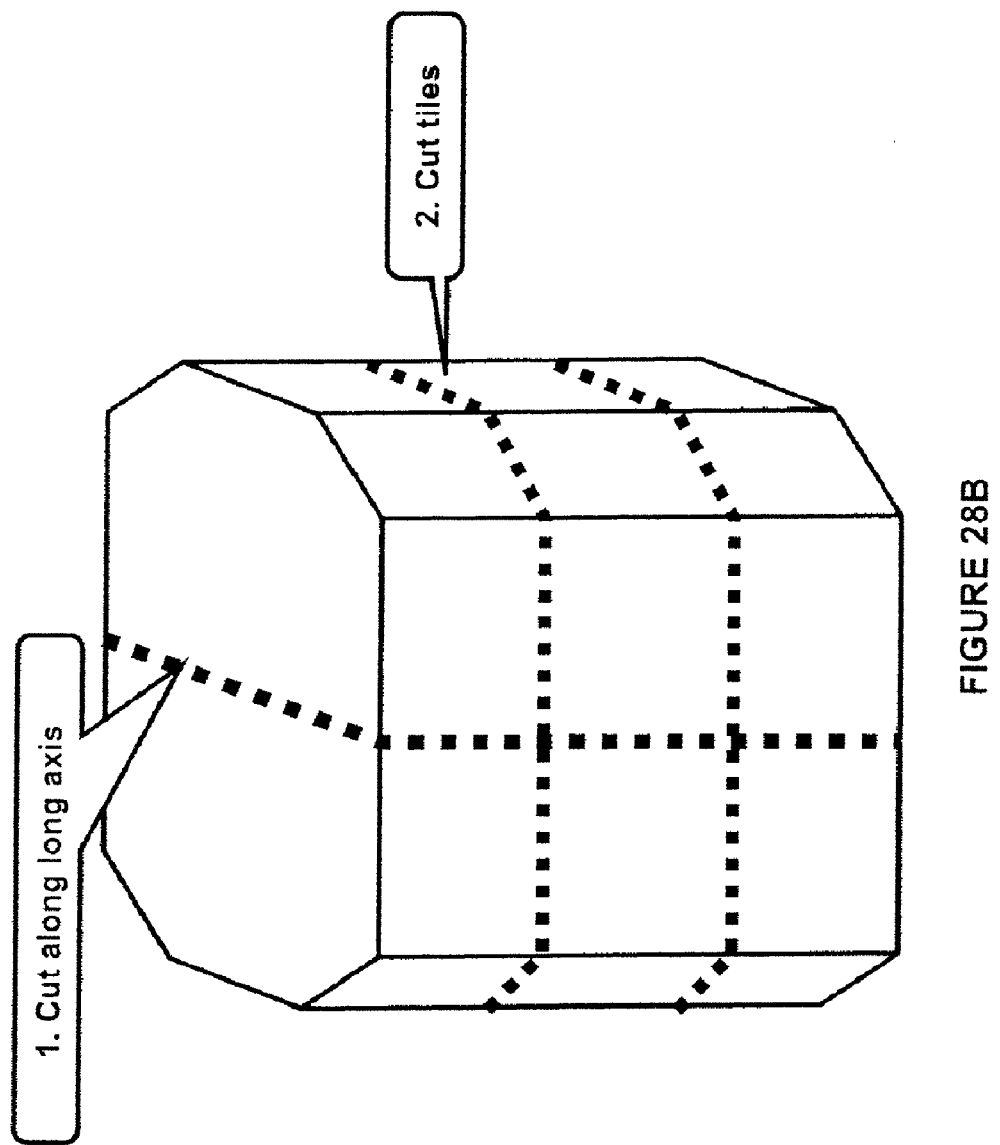
Figure 28C:
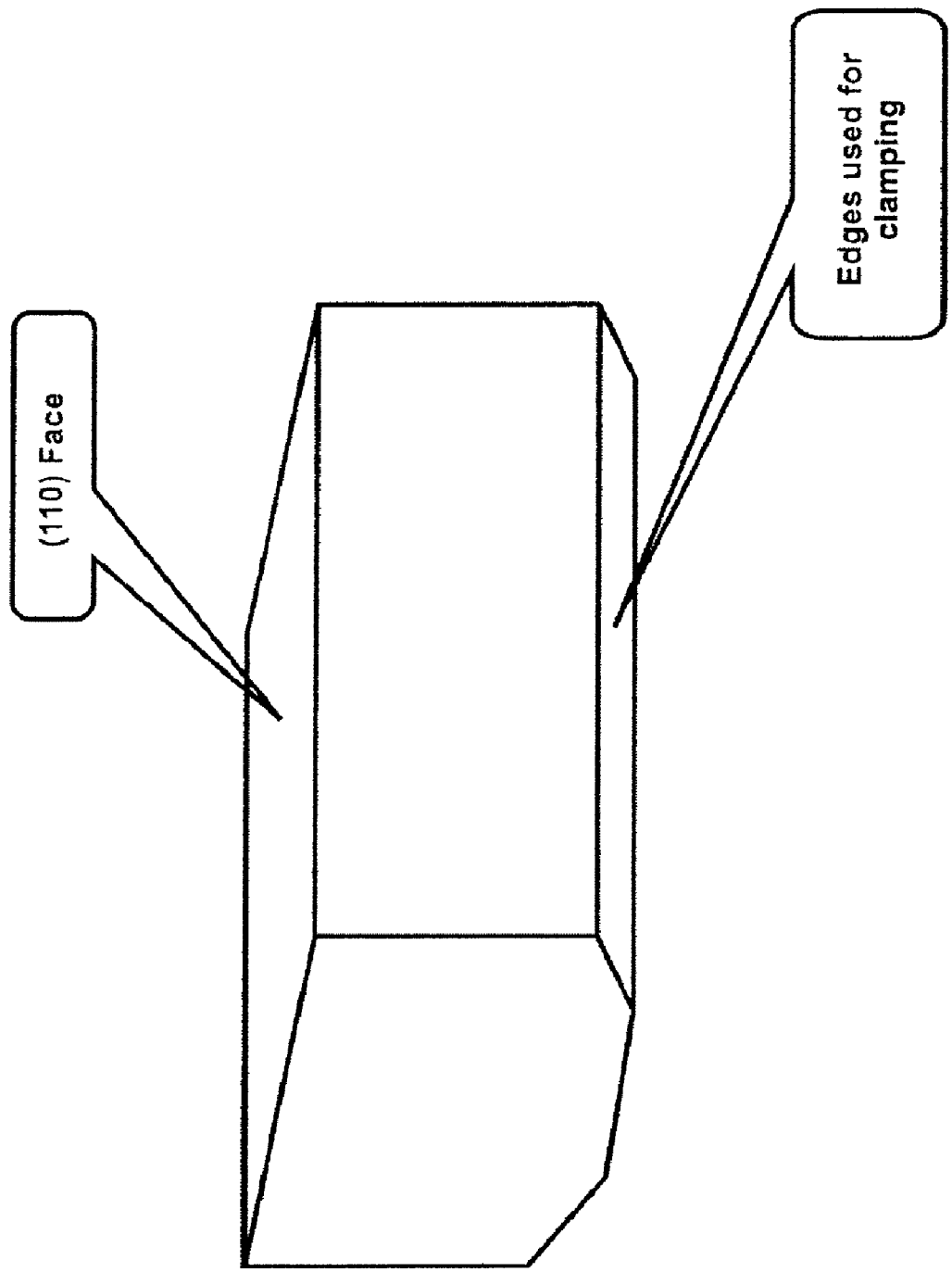

Moreover, as shown in FIGS. 28A-C, a single crystal silicon boule grown conventionally with a face having a (100) crystal orientation, may readily be converted to a single crystal boule having the face having a (110) crystal orientation.

Specifically, FIG. 28A shows the conventional process for growing or casting a single crystal silicon ingot or boule, followed by cropping of the end to expose a face having a (100) crystal orientation. Next, the cropped boules are squared or bricked, followed by edge grinding to produce an ingot having a face and sides having (100) crystal orientation.

Next, as shown in FIG. 28B, the (100) face of the ingot is cut in half along the long axis to get 2 halves with a (110) long face. As shown in FIG. 28C, the long rectangle is then cut into squares where the corners are now on the bottom. Little usable material is lost by this approach, however, because these lower sides of the cut material will likely be used to clamp or secure the boule during processing.

In accordance with still other embodiments, a single crystal silicon donor substrate having a (111) surface orientation may be used. Such a configuration offers a lower cleaving energy and a resistance to cleaving failure and branching that can be exhibited by single crystal silicon with faces oriented along (100) or (110).

Other characteristics of single crystal silicon can also influence the choice of donor substrate material. For example, certain applications may utilize a single crystal silicon donor substrate created utilizing Czochralski (CZ) growth. Other applications may utilize a single crystal silicon donor substrate created by a float zone (FZ) growth method.

Depending upon the embodiment, the cleave region can be formed using a variety of techniques. That is, the cleave region can be formed using any suitable combination of implanted particles, deposited layers, diffused materials, patterned regions, and other techniques. Referring to FIG. 7, the method introduces certain energetic particles using an implant process 712 through a top surface of a donor substrate to a selected depth, which defines a thickness of the material region, termed the "thin film" of material. A variety of techniques can be used to implant the energetic particles into the silicon wafer. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other mass and non-mass specific techniques. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $1\times10^{15}$ to about $1\times10^{18}$ atoms/cm$^2$, and preferably the dose is greater than about $1\times10^{16}$ atoms/cm$^2$. Implantation energy ranges from about 1 KeV to a few MeV, and is generally about 50 KeV for the formation of thin films useful for semiconductor applications. Implantation temperature ranges from about 20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about ±0.03 to ±1.5 microns. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness ranges from about 13 nm to about 3 um using proton implant energy ranges from about 10 keV to about 300 keV. Such a silicon film thickness can be suitable for a template for a epitaxial thickening process (e.g., homoepitaxial growth process or a heteroepitaxial growth process) for subsequent solar cell formation. Of course there can be other variations, modifications, and alternatives.

In a specific embodiment, silicon film thickness ranges from about 1 um to about 50 um can be achieved by using a proton implant energy ranges from about 120 keV to about 2.1 MeV. The silicon film in this thickness range can be detached to provide a thickness of a single-crystal silicon film of sufficient thickness to form a thin-film solar cell directly with good efficiency. That is, the thickness range of single crystal silicon formed does not need to be further thickened to be used as an efficient light absorber layer in solar cell application. Techniques to maximize thin-film silicon solar cell efficiencies such as front/back contact formation, use of two-sided access manufacturing and light scattering layers to trap more light within the thin-film light absorber layer have been well developed and can be used in combination with this detached layer. Such techniques are well covered, for example, by "Thin-Film Crystalline Silicon Solar Cells—Physics and Technology" by Rolf Brendel (2003 Wiley-VCH Verlag GmbH & Co., KGaA, Weinheim), which is incorporated by reference herein. Of course, there can be other variations, modifications, and alternatives.

In a specific embodiment, a silicon film thickness ranges from about 50 um to about 200 um may be formed using a proton implant having an energy range of about 2.1 MeV to about 5 MeV. This range of silicon film thickness allows the detachment of a thickness of a single-crystal silicon substrate equivalent that can be used as a free standing silicon substrates. Single crystal silicon substrate in the thickness range of 50 um to 200 um may be used to replace present method of using wafer sawing, etching and polishing processes. As opposed to about 50% kerf loss in the present technologies (kerf loss as being defined as the material lost during the cutting and wafering operations), the implant cleaving technique has virtually no kerf loss resulting in substantial cost savings and material utilization efficiency improvements. Energies higher than 5 MeV may be used to make semiconductor processing alternative substrate materials, but in solar cell manufacturing, 200 um is desired for silicon solar cell material thickness for bulk silicon solar cell formation. As a result, thicker silicon substrates are not of particular commercial interest for fabricating solar cell according to a specific embodiment.

While the above embodiments describe a process in which particles are implanted uniformly across the entire surface of the substrate, this is not required by the present invention. Alternative embodiments in accordance with the present invention can employ a patterned implantation approach, for example wherein a higher dose is implanted at the edge of the substrate, in order to facilitate initiation of the cleaving process at the edge. Inner areas of the substrate may be implanted with lower doses to support propagation of the cleaving that has been initiated at the edge. In accordance with one particular embodiment, all edge portions (not limited to where cleaving is initiated) can be implanted at higher doses in order to pin those edge portions to the cleave plane.

Figure 8:
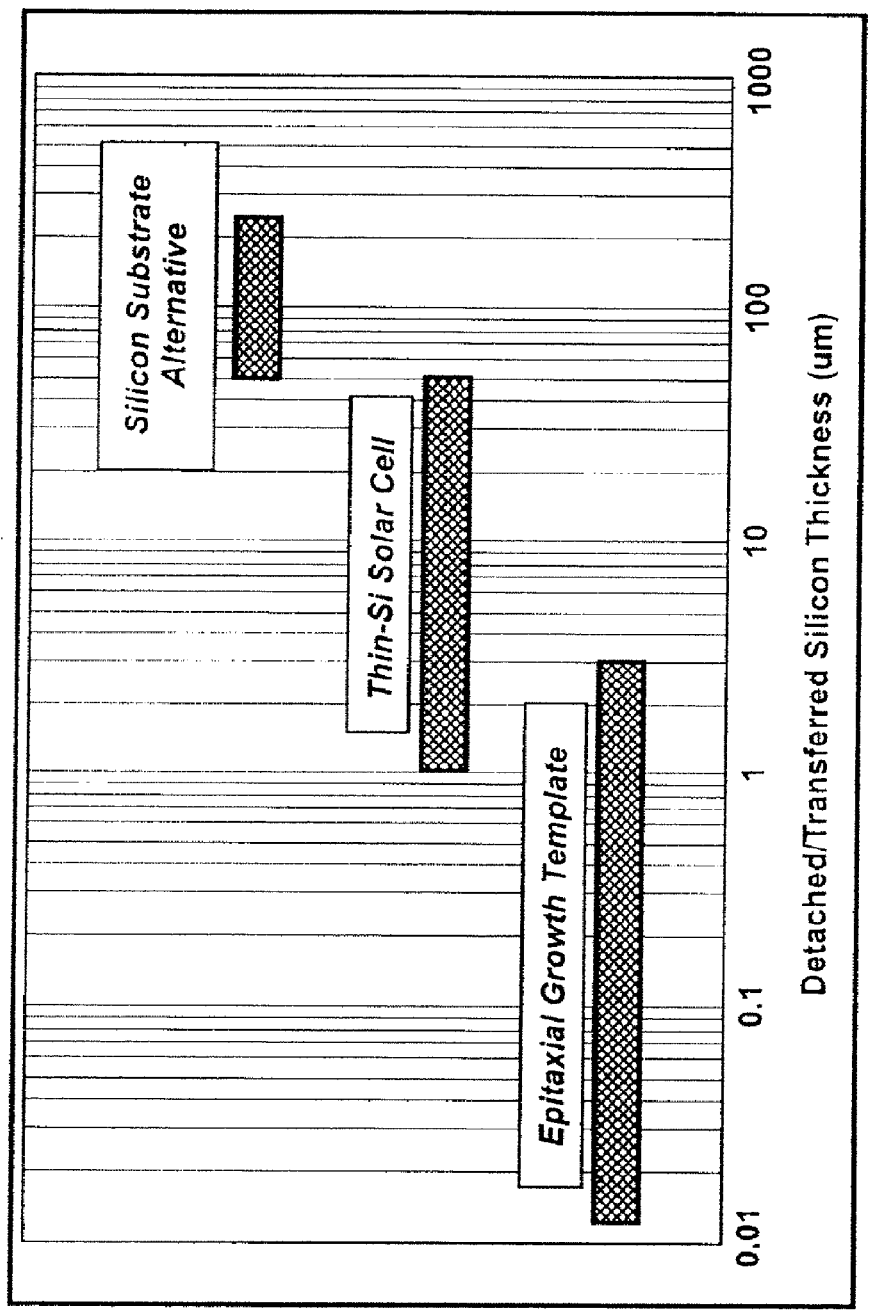

FIG. 8 illustrates ranges of energies and classes of silicon solar cell absorber application in proton implantation. The MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983), which is hereby incorporated by reference. In V. G. Reutov and Sh. Sh. Ibragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In a preferred embodiment, the silicon material is sufficiently thick and is free from a handle substrate, which acts as a supporting member. Of course, the particular process for handling and processing of the film will depend on the specific process and application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. A resulting substrate, which has been subject to implant, is illustrated by the simplified diagram of FIG. 9.

In a specific embodiment, the use of a large-area implanter utilizing plasma-immersion ion implant or ion shower technologies, especially non-mass selected implanters, may co-implant undesirable contaminants through silicon surface. For example, the implantation of iron can substantially lower the effective minority carrier lifetime of the resulting silicon absorber layer and thus cause an undesirable lowering of the light conversion efficiency. Due to the larger implantation range of hydrogen, a screening layer can be provided to prevent iron from entering into the crystalline silicon film. The thickness of the screening layer would depend on the implant energy, the contaminant being screened, and the screen material. Using silicon dioxide as the screening layer and iron as the contaminant as an example, a 300 keV implant would require about 0.3 um of silicon dioxide thickness to completely stop iron from entering a silicon substrate. A 5 MeV hydrogen implant would require a 3.5 um to 4 um thick silicon dioxide layer. The silicon oxide layer can be removed using a chemical strip such as an HF strip or a polishing step, among others. The silicon dioxide layer may also be kept throughout the cell manufacturing process depending on the embodiments. In accordance with still other embodiments, the screening layer can be retained and incorporated into the solar cell in its completed form. Of course, there can be other variations, modifications, and alternatives. For example, while the above example describes silicon dioxide as the screening layer, this is not required by the present invention. Other materials, including combinations of materials, and not limited to dielectric materials, could alternatively be used as screening layers.

Depending upon the embodiment, there may be other techniques for forming a cleave region and/or cleave layer. As merely an example, such cleave region is formed using other processes, such as those called a Nanocleave™ process of Silicon Genesis Corporation of Santa Clara, Calif., a Smart-Cut™ process of Soitec SA of France, and an Eltran™ process of Canon Inc. of Tokyo, Japan, any like processes, and others. Of course, there may be other variations, modifications, and alternatives.

Figure 9:
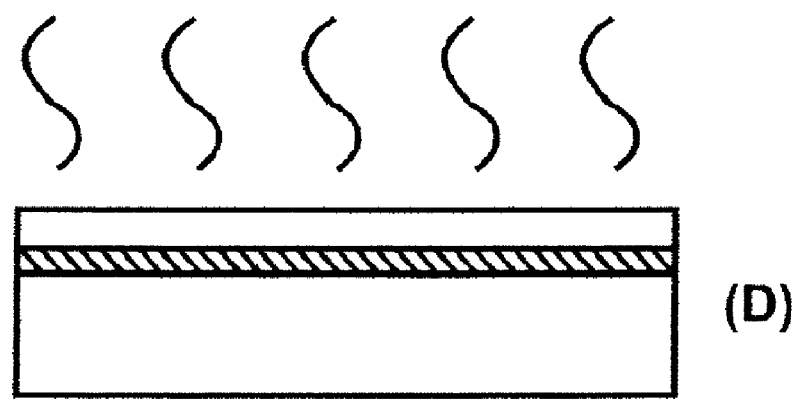

In a specific embodiment, the transparent handle substrate, which has been coupled to a backing, and donor substrate are both subjected to plasma activated processes, as shown in part in FIG. 9. Such plasma activated processes clean and/or activate the surfaces of the substrates. The plasma activated processes are provided using an oxygen or a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Figure 10:
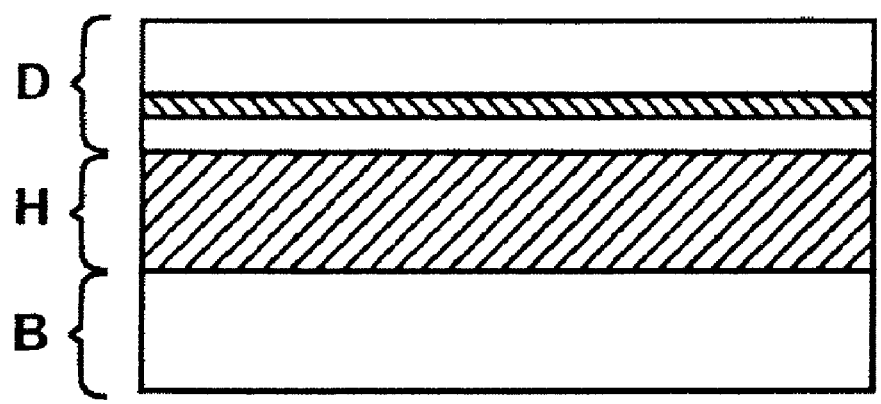

Thereafter, each of these substrates is bonded together, as also illustrated by FIG. 10. As shown, the handle substrate has been bonded to donor wafer. The substrates are preferably bonded using an EVG 850 bonding tool manufactured by Electronic Vision Group or other like processes. Other types of tools such as those manufactured by Karl Suss may also be used. Of course, there can be other variations, modifications, and alternatives. Preferably, bonding between the transparent handle substrate and the donor is substantially permanent and has good reliability.

Accordingly after bonding, the bonded structure is subjected to a bake treatment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for silicon donor substrates and transparent handle substrates. In a specific embodiment, the present bake treatment can occur using a conductive heating process with a hot plate and/or surfaces, which directly couple thermal energy directly from the hot plate to the bonded substrate. In other embodiments, the thermal energy can be provided using radiation, conduction, convection, or any combination of these techniques, and the like. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. Another consideration of this step in combination with the plasma-activation surface treatment is to allow the bond strength to be increased to eliminate delamination of the assembly during the same bake treatment step, usually caused by stresses induced by the coefficient of thermal expansion mismatch of the dissimilar materials used. In a specific embodiment, the low temperature bonding process occurs by a self-bonding process. In particular, one wafer is stripped to remove oxidation there from (or one substrate is not oxidized). A cleaning solution treats the surface of the wafer to form O—H bonds on the wafer surface. An example of a solution used to clean the wafer is a mixture of hydrogen peroxide and sulfuric acid, and other like solutions. A dryer dries the wafer surfaces to remove any residual liquids or particles from the substrate surfaces. Self-bonding occurs by placing surfaces of cleaned substrates together. Of course there can be other variations, modifications, and alternatives.

Alternatively, an adhesive can be disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the donor wafer to the handle substrates. For instance, an electro-static bonding technique can be used to join the two substrates together. In particular, one or both substrate surface(s) is charged to attract to the other substrate surface. Additionally, the donor substrate can be fused to the handle wafer using a variety of other commonly known techniques. In a specific embodiment, the present bonding process to join the donor and handle substrates together can use an in-situ plasma activated bonding process, an in-situ electro-static bonding process, any combination of these, and the like. Of course, the technique used depends upon the application.

In a preferred embodiment, the method uses an optical coupling material between the two substrates. The optical coupling material is any suitable material that has a refractive index of about 1.8 to about 2.2, but can be others. The material can be selected from Tin Oxide, Indium Tin Oxide (ITO), Zinc Oxide (ZnO) Titanium Dioxide, silicon nitride, or other anti-reflection or dielectric stack formation materials, and the like, including combination of these. Depending upon the embodiment, the material can include one or more layers, and other configurations. Of course, there can be other variations, modifications, and alternatives.

Figure 11:
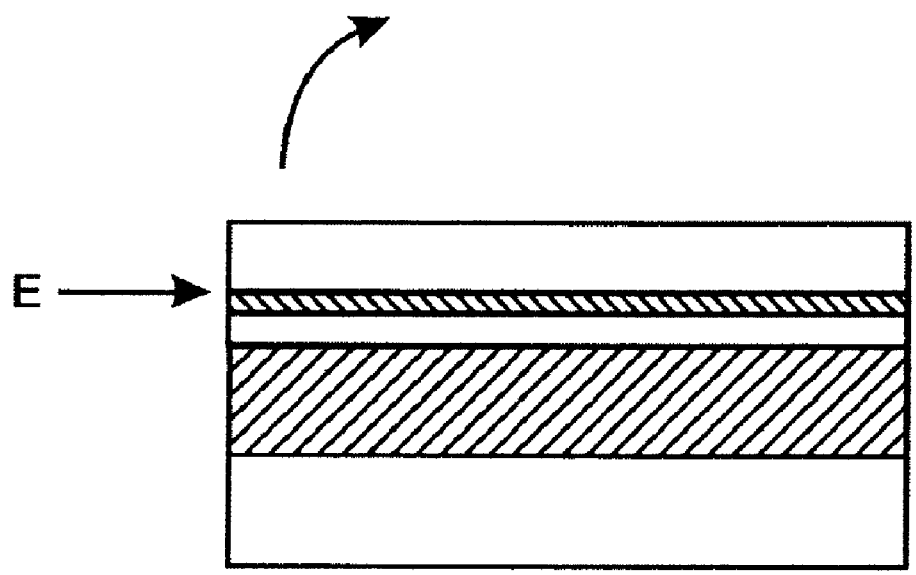
Figure 12:
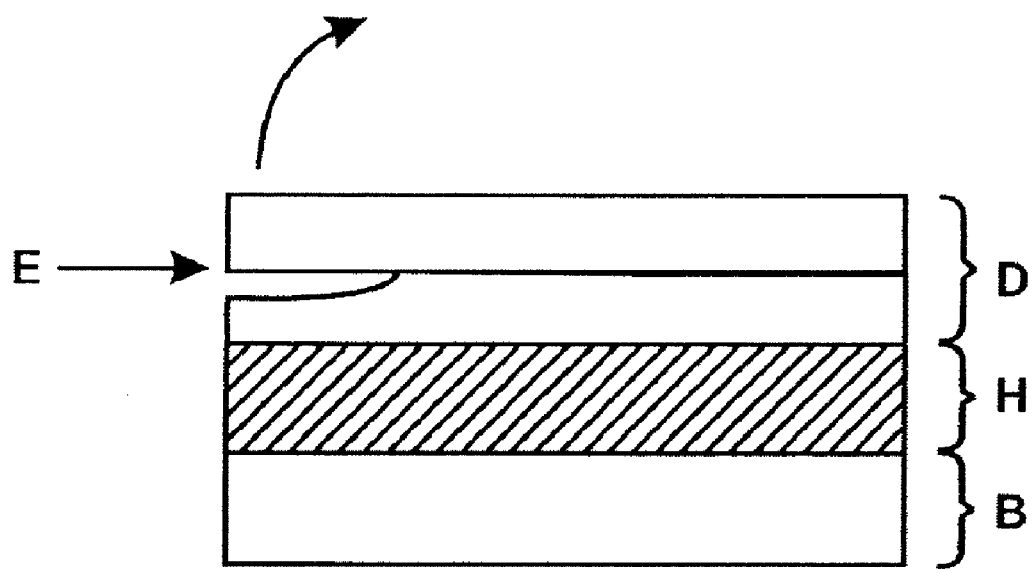

The method performs a controlled cleaving process on the bonded substrate structure, as illustrated by FIGS. 11 and 12. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes.

In accordance with certain embodiments, the controlled cleaving process may employ the application of thermal energy. For example, in the particular embodiment shown in FIG. 29, a beam of thermal energy 2900 (such as a laser beam) may be applied to the surface 2902 of the substrate 2904 having a subsurface cleave plane 2906 comprised of a plurality of gettering sites. The temperature gradient along the direction of the cleave plane between the localized heated silicon and the adjacent cooler silicon areas, imparts fracture stress (which can be tensile stresses and others) to the silicon. This fracture stress in turn gives rise to cleaving along the direction of the cleave plane. This region of fracture stress is translated along the direction of the cleave plane, as the thermal beam source, the substrate, or both are translated along the direction of the cleave plane.

Exercising control over various parameters may allow for optimization of the cleaving process. Examples of such parameters include but are not limited to the intensity and duration of the thermal beam, spatial size and temporal pulse profile of the beam, and the speed of translation of the thermal beam. The beam can be a spot (2D) or a line shape (1D) across part or the whole of the tile. The width of the beam can have a strong influence on the magnitude of the thermally generated fracture stress field that can be produced by this configuration.

Figure 29:
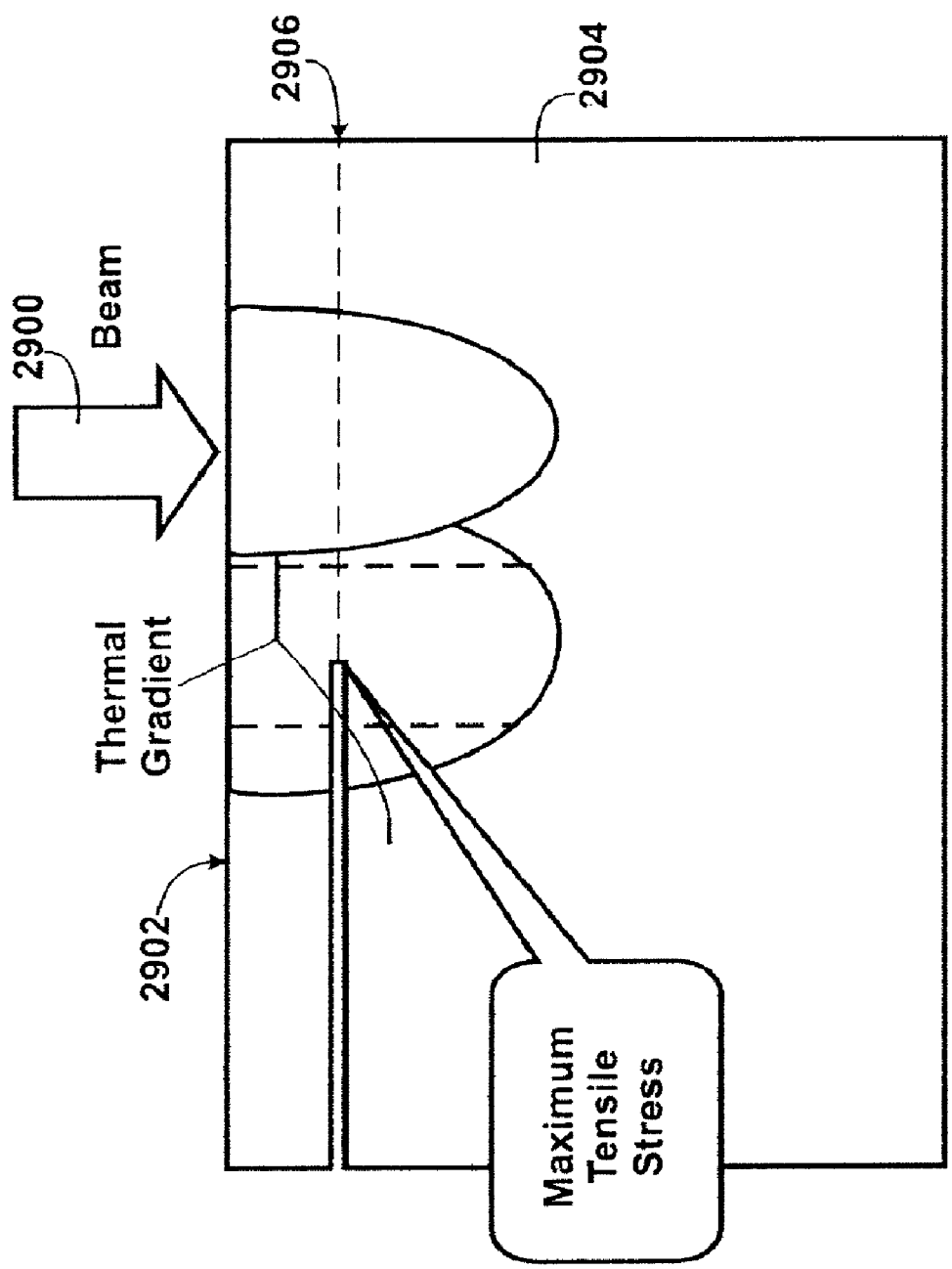
FIG. 29 shows a simplified cross-sectional view of the application of a thermal beam to perform controlled cleaving according to one embodiment of the present invention.

While the particular embodiment shown in FIG. 29 shows cleaving caused by a thermal beam, this is not required. In accordance with alternative embodiments, thermal energy could be imparted to the cleave plane by another type of beam. For example, in one embodiment the thermal energy could be imparted by a beam of particles (such as ions) impacting the substrate. In one particular embodiment, the particles of this beam could comprise the same particles that are implanted to create the gettering sites or defect regions of the cleave plane.

The localized heating of the silicon shown in FIG. 29 also gives rise to a temperature gradient in the vertical direction orthogonal to the direction of the cleave plane. And, owing at least to 1) the smaller volume of silicon overlying the cleave plane, and 2) the directional source of the thermal beam, this vertical temperature gradient is asymmetrical, being steepest in the direction leading toward the surface of the substrate. Such an asymmetrical temperature gradient can impart an unwanted vertical directionality to the resulting tensile force and resulting cleaving action unless the configuration is optimized, for example by positioning the beam source sufficiently ahead of the crack front that this thermal profile asymmetry is largely cancelled).

Figure 30:
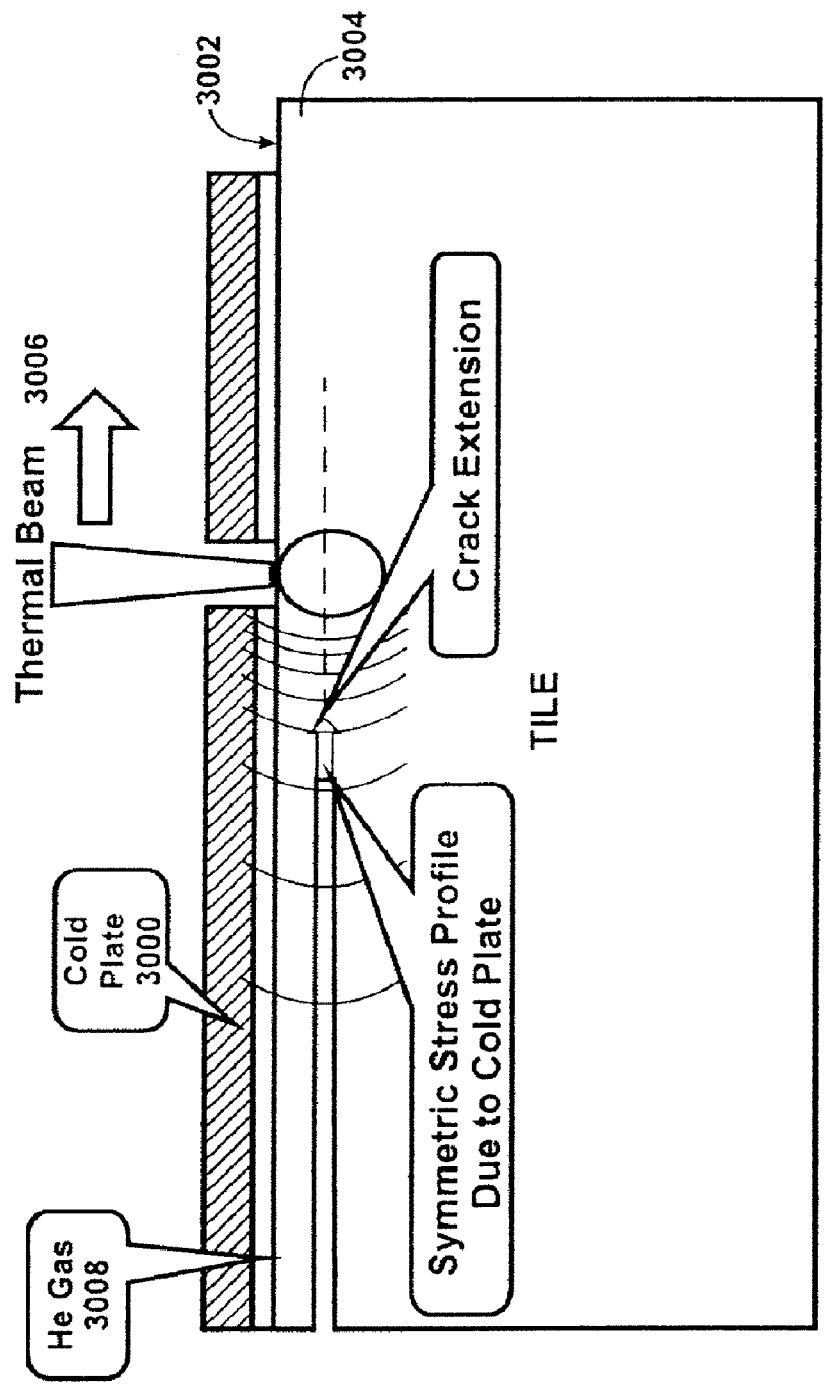
FIG. 30 shows a simplified cross-sectional view of the application of a thermal beam to perform controlled cleaving according to another embodiment of the present invention.

Accordingly, FIG. 30 shows a simplified cross-sectional view of an alternative embodiment of a cleaving approach according to the present invention, wherein a cold plate 3000 is positioned proximate to the surface 3002 of the substrate 3004 receiving the thermal beam 3006. Here, the cold plate is separated from the substrate surface by a layer of Helium gas. The presence of cold plate 3000 serves to equilibrate the steepness of the temperature gradient present on either side of the cleave plane, such that there is little or no gradient of stresses that can act as a shear force to possibly change cleave direction in the vertical direction. This lack of shear forces reduces the possibility of cracks extending into a depth of the substrate resulting in a rough surface, and a free standing film of uneven thickness.

Figure 31:
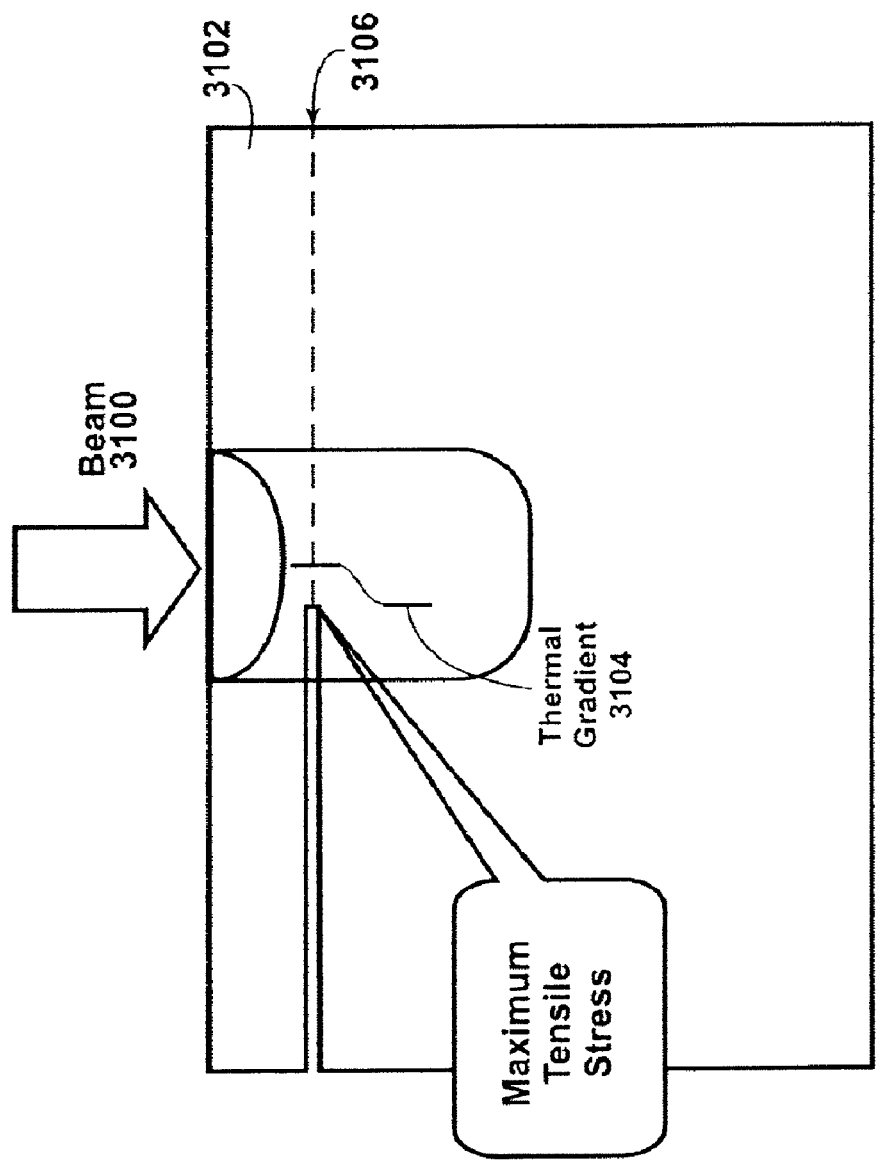
FIG. 31 shows a simplified cross-sectional view of the application of a thermal beam to perform controlled cleaving according to yet another embodiment of the present invention.

While the embodiment described above seeks to avoid the existence of an asymmetrical thermal gradient in the vertical direction, alternative approaches in accordance with the present invention may utilize such a thermal gradient to accomplish cleaving. FIG. 31 shows a simplified cross-sectional view of a cleaving method according to such an alternative embodiment, wherein application of thermal energy (here in the form of a beam 3100) to the surface of the substrate 3102 results in a vertical temperature gradient 3104 that will generate a shear stress at the cleave plane 3106. In such a case, this shear stress will couple a Mode II (shear mode) stress intensity factor that can give rise to the cleaving action across the cleave plane. Such sources can be, for example a rapid-thermal process system or a flashlamp based light source. Because the thermally induced stresses are proportional to thermal gradient changes, the microsecond to millisecond thermal pulse characteristics of the flashlamp based systems may be advantageous, although rapid thermal annealing (RTA) systems do work.

While the embodiment of the present invention shown in FIG. 31 utilizes a locally applied beam of thermal energy, this is not required. In accordance with other embodiments of the present invention, the thermal energy could be globally applied to the surface of the substrate in order to induce the vertical temperature gradient and shear force across the cleave plane that gives rise to the controlled cleaving.

Moreover, while the embodiments of the present invention shown in FIGS. 29-31 utilize thermal energy in performing the controlled cleaving process, this is not required by the present invention. In accordance with alternative embodiments, the application of energy other than thermal energy can give rise to cleaving along a cleave plane.

For example, in the technique of laser shock peening, an intense laser beam (for example of 1-20 nanoseconds in duration and about 1 GW/cm$^2$ or more in intensity) is applied to a surface of a material. The intense laser causes vaporization of the surface material to create a localized plasma and a compressive shock wave coupled to the material. If the surface is immersed in a fluid (most commonly water), the water can also be vaporized to generate the compressive shock wave and is highly intensified (about 3-4 times in water) with peak stress intensities of 1 to 3 GPa or higher. This intense shock wave can be transmitted through the bulk material as a compressive stress wave, which upon reflection from the end of the bulk material turns into a tensile stress wave of approximately equal magnitude.

Figure 32:
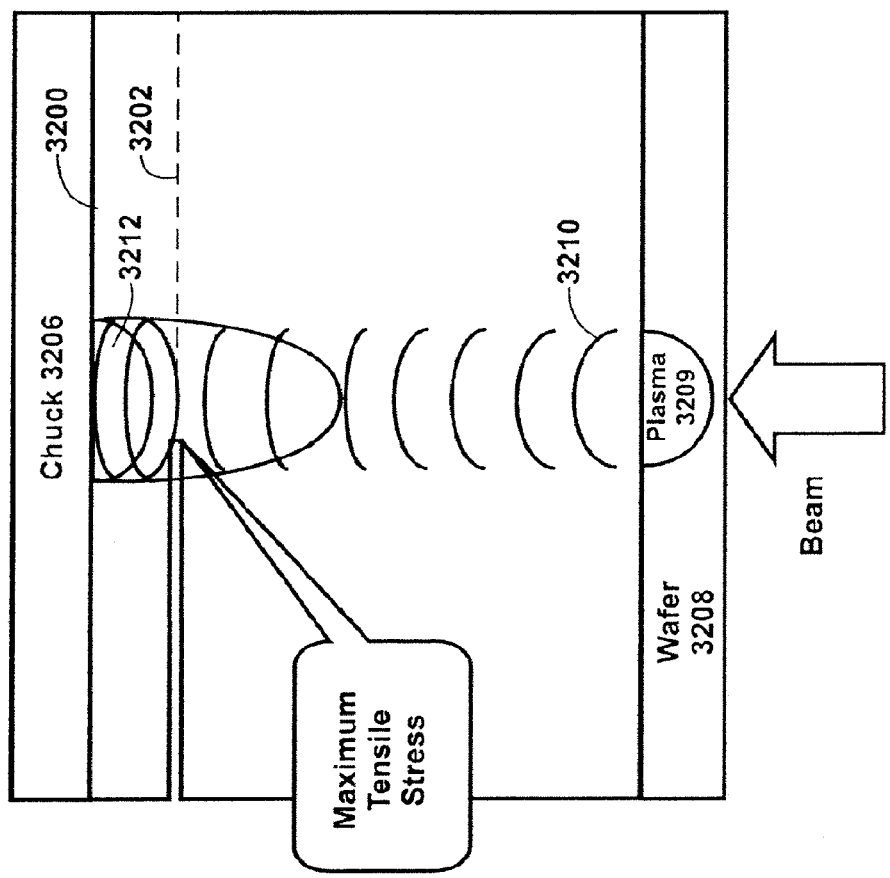
FIG. 32 shows a simplified cross-sectional view of the application of laser shock peening to perform controlled cleaving according to still another embodiment of the present invention.

FIG. 32 shows a simplified cross-sectional view of an example of the use of laser shock peening to perform a controlled cleaving process according to an embodiment of the present invention. Specifically, substrate 3200 has a subsurface cleave plane 3202 previously formed by ion implantation of hydrogen or other materials into a first surface 3204. This first surface is supported on chuck 3206, for example through a vacuum or electrostatic force.

A film of water 3208 is formed on the second surface 3205 surface, and then energy in the form of a laser beam is applied to the first surface. Heating of the water by the laser gives rise to a local plasma 3209, which then generates the shock wave and corresponding compressive force 3210 that propagates through the thickness of the substrate.

Upon reaching the front face of the substrate supported by the chuck, the shock wave is reflected back as a tensile stress wave 3212. As this tensile stress wave reaches the cleave plane containing the gettering sites and defect regions, where the tensile stresses induce a controlled cleaving action.

The laser shock peening generates a transient shock wave to generate a tensile stress wave that interacts with the cleave plane during its passing. An alternative technique is to use an ultrasonic transducer that can generate a continuous wave (CW) or modulated ultrasonic wave of MHz and GHz frequency range within the substrate, to cause the fracture extensions along the cleave plane. For example, the transducer can be placed on the bottom of the substrate, and through a suitable coupling medium an incident ultrasonic wave can be efficiently coupled into the silicon material. The resulting wave acts much like the sharp transient introduced by the laser shock peening technique except both tensile and compressive waves are generated by this technique.

When the waves cross the plane of the cleave plane and reflect from the surface, the incident tensile waves can interact directly with the cleave plane. Or, upon reflection from the surface, the incident and surface reflected waves form a standing wave in the vicinity of the cleave plane.

If the incident ultrasonic frequency is chosen where the film above the cleave plane is equal to the distance traveled by a quarter-period of the ultrasonic frequency (or a multiple half-wave thereof), there will be an additive constructive interference effect where the compressive and tensile components of the traveling and ultrasonic waves will add at the depth of the cleave plane. The result will be a stronger compressive/tensile standing wave that can extend the fracture plane at every tensile half-cycle. Assuming a sound velocity ($v_{Si}$) in silicon of roughly 2.5 km/sec, and a 50 micron cleave plane depth defining the film thickness ($t_{film}$), the fundamental ultrasonic frequency is $F_{ultrasound} = v_{Si}/4*t_{film} = 12.5$ MHz. Other standing waves are higher in frequency by $F_{ultrasound} = (n+\frac{1}{2})*v_{Si}/2*t_{film}$ (n=0, 1, 2 . . . ). The ultrasonic energy can either be focused onto the vicinity of the advancing cleave front or unfocussed.

In yet another embodiment, using the above standing wave method a higher frequency can be used to generate a more vertically localized compressive-tensile-compressive standing wave. The large pressure gradient variations in the vertical direction can be more energetically favorable to extend the fracture.

In one half-cycle, a tensile stress is maximized at the cleave plane to cause crack extension with compressive stress components above and below the cleave plane. This will tend to help extend the crack in a controlled vertical dimension. During the other half-cycle, the crack will see a compressive components which will stop crack extension. The resulting effect is a strong guiding of the plane within the center of the tensile standing wave component.

Frequency modulation can be used as a vertical guiding effect where a higher frequency would create a net shear towards the surface while a lower frequency would create a net shear away from the surface. This in principle can guide a fracture vertically during the cleaving process. The ultrasonic energy can either be focused onto the vicinity of the advancing cleave front or unfocussed.

If the cleave plane is started at the selected depth (by an edge or perimeter patterned implant for example), this high-frequency ultrasonic standing wave guiding could extend the cleave along the selected depth by frequency control and allowing the plane to extend within the selected depth. Lower implant doses (even none within the propagating area) could be required once the cleave plane is locked by the standing wave. This technique would then allow better productivity and cost-effectiveness. Of course, ultrasonic energy can be employed in combination with one or more cleaving techniques described elsewhere in the instant patent application (including but not limited to mechanical separation stresses and scanned thermal beams) in order to optimize a film cleave process.

While some of the above description relates to the cleaving of a bonded substrate structure, this is not required by the present invention. In accordance with alternative embodiments, a free standing film of material may be cleaved from a single substrate.

For purposes of the following disclosure, a "free standing film" or "free standing layer" is defined as a film of material that can maintain its structural integrity (i.e not crumble or break apart), without being in contact with a supporting member such as a handle or transfer substrate. Typically, very thin films (for example silicon films thinner than about 5-10 μm) are unable to be handled without breaking Conventionally, such thin films are manipulated using a supporting structure, which may also be needed to create the thin film in the first place. Handling of thicker films (i.e. silicon films having a thickness of between 20-50 μm) may be facilitated by the use of a support, but such a support is not mandatory. Accordingly embodiments of the present invention relate the fabrication of free standing films of silicon having a thickness of greater than 20 μm.

Figure 13:
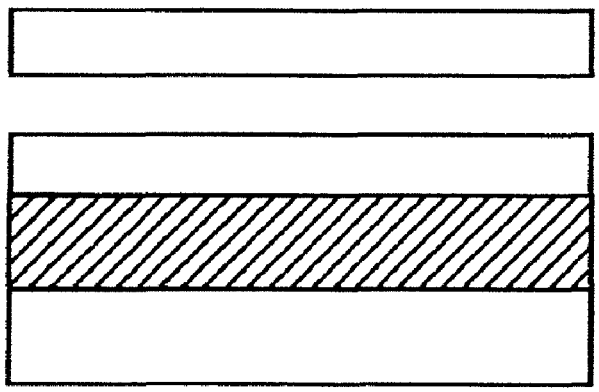

The method next frees the thickness of material from the donor substrate to completely remove the thickness of material from the donor substrate, as shown by FIG. 13. Depending on embodiment, the method of detaching the film is a function of the thickness of the film and its ability to be handled or processed without being attached to a supporting substrate, temporarily or permanently. For very thin-films used for epitaxial template growth for example, the transfer of the film onto a temporary or permanent substrate is necessary to avoid damaging the film. For material film thicknesses exceeding about 50 um, the films may be handled in a free standing manner to be used, for example, in the manufacture of solar cells. A temporary supporting substrate for films of about 3 um to about 50 um for crystalline solar cell applications would be useful to access and process both sides of the detached silicon thin-film to optimize the resulting photovoltaic device. Permanent bonding and transfer of the detached silicon thin-film onto a permanent substrate may have benefit in simplifying the film handling process. Pre-processing of the donor surface prior to or after the implantation step, such as surface texturing, maximizing surface reflective properties, passivation contact formation, and surface doping, may allow process to this surface to eliminate the need of a temporary supporting substrate. Of course, the choice of the supporting substrate and manufacturing process flow depends on the application and the photovoltaic cell structure. Taking the photovoltaic cell design exemplified in FIG. 17 as an illustration. The photovoltaic cell structure has contact layers formed on the top surface regions and the back surface region. As shown, light may traverse through the glass substrate and coupled to the bottom of the light absorbing layer using a light coupling layer in a specific embodiment. Example of such light coupling layer may include silicon nitride or other materials having a suitable refractive index and thickness. Preferably, the thickness of the light coupling layer provides a quarter-wave matching layer. Other examples of the light coupling layer may include multiple layers of dielectric stack with appropriate thickness and refractive index to improve light coupling efficiency by broadening the wavelength range of maximum light transmission. In a specific embodiment, light trapping schemes such as texturing using an appropriately textured layer or by texturing the transparent substrate, or a combination may also be used to improve light transmission efficiency to the light absorbing layer. In an alternative embodiment, the bottom surface of the light absorbing layer can also be passivated using an appropriate layer, which can also be the light coupling layer. A thin amorphous silicon layer can act as an excellent passivation layer to limit surface carrier recombination velocity and maximize carrier lifetime. The film is detached on the transparent substrate and the top is passivated, textured and contacted with alternating contacts to the absorber and the junction (for example, diffused, Schottky metal, or doped amorphous emitters are possible). To maximize cell efficiency, the top surface of the absorber can be textured and highly reflective to keep the light within the absorber. Absorber contacts can be made using front interdigitated contacts. If a bottom contact doped layer is used, these can be connected with via contacts through the cell. This structure would maximize light collection efficiency (measured as the fraction of light collection area that light is not occluded over total light collection area) since the contacts would be on the top side of the absorber.

Figure 14:
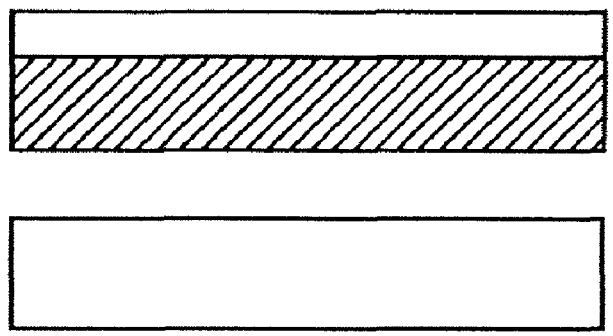

In a preferred embodiment, the method removes the backing substrate from the transparent handle substrate, as illustrated in FIG. 14. In a preferred embodiment, the attachment between the backing substrate and handle substrate is temporary and can be removed with a mechanical force without damaging either substrates. In a specific embodiment, a separation process may be used to detach the backing substrate from the handle substrate. In a specific embodiment, the backing substrate can also be released when the backing substrate member has been provided using an electrostatic, vacuum, or mechanical chuck and/or attachment device. Of course, there can be other variations, modifications, and alternatives.

Figure 15:
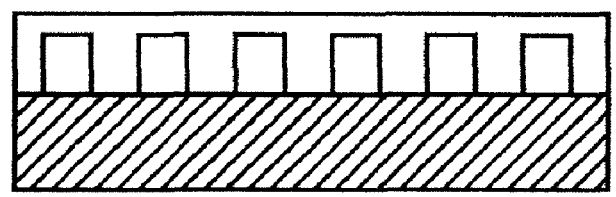

Referring to FIG. 15, the method forms photovoltaic devices onto surfaces of the thickness of material. Such devices can include integrated semiconductor devices and photovoltaic devices. Such devices can be made using deposition, etching, implantation, photo masking processes, ink jet printing, screen printing, any combination of these, and the like. Of course, there can be other variations, modifications, and alternatives.

In a specific embodiment, the method can also thicken the thickness of transferred material using a deposition process. In a specific embodiment, the method uses a solid phase epitaxial process and/or other forms of deposition processes. The process can form a suitable single crystal silicon or like material according to a specific embodiment. As merely an example, the material can be amorphous silicon, polycrystalline silicon, germanium and silicon germanium alloy. For example, amorphous silicon could advantageously allow for solid-phase epitaxial growth of single-crystal silicon using the underlying transferred silicon film as a template. Another method that can increase the effective rate of silicon material deposition is to spray or coat the surface with silicon nanoparticles (advantageously amorphous silicon) which can be thermally treated to produce single-crystal silicon using the underlying transferred silicon film as a template. This can be applied dry of using a liquid that would be eliminated during subsequent processing. Polycrystalline silicon and other materials may also allow single-crystal regrowth using appropriate treatments such as laser anneals, flash thermal treatments and the like. Of course, there can be other variations, modifications, and alternatives.

In a specific embodiment, the present method includes an etching and/or deposition process (e.g., plasma assisted deposition/etching) for smoothing the cleaved surface region before any step of forming photovoltaic regions and/or forming the thickened layer. The method can use a smoothing process that includes thermal treatment of the cleaved film using a hydrogen and hydrogen chloride containing environment according to a specific embodiment. Alternatively, the etchant can be a chemical bath (e.g., KOH, TMAH) to etch and if desired, texture the cleaved film to a predetermined amount. The etching process can be used to remove about 300 to about 800 Angstroms of hydrogen damaged silicon, as an example. In a specific embodiment, the etching process can also be preceded by an oxidation process to convert the hydrogen damaged region into oxide, which is later stripped using a buffered oxide etch and/or other suitable etching species. Pursuant to this surface treatment, surface passivation to control carrier surface recombination can be made through one or more of commonly known techniques such as an oxide, silicon nitride, or silicon carbide film formation, hydrogenation or deposition of a thin amorphous silicon film. The quality of the passivated surface is measured using a surface recombination velocity (SRV in units of cm/sec). Excellent surface passivation would have SRV values of roughly 10-100 cm/sec while cell efficiency degradation of thin-film (5-10 micron) crystalline silicon cells would be dominated by surface passivation for SRV values above 1000 cm/sec. The SRV effect on cell efficiency for thin-film silicon cells are explained in the Brendel reference and in a related paper by Brendel entitled "A Novel Process for Ultra-Thin Monocrystalline Silicon Solar Cells on Glass", 14th European Photovoltaic Solar Energy Conference, Barcelona, Spain, 30 Jun.-4 Jul. 1997, which is hereby incorporated by reference. Of course, there can be other variations, modifications, and alternatives.

In a preferred embodiment, the transferred material is thickened using an amorphous silicon layer. In a preferred embodiment, the amorphous silicon layer is crystallized or the like. In a specific embodiment, the amorphous silicon layer is deposited using application of nanoparticles (e.g., amorphous silicon, crystalline silicon, polysilicon, or combinations of these), which are later subjected to a thermal treatment to cause formation of a sheet of thickened material. Alternatively, the amorphous silicon layer can be formed using physical vapor deposition or chemical vapor deposition (e.g., plasma enhanced) at low temperature according to a specific embodiment. In a preferred embodiment, the amorphous silicon layer, which has been deposited overlying a glass material, is maintained at a temperature of less than 500 Degrees Celsius during formation of such silicon layer. In a specific embodiment, the resulting film can be a single crystal and/or polycrystalline structure according to a specific embodiment. In preferred embodiments, the resulting film is single crystalline and has suitable electrical characteristics. Of course, there can be other variations, modifications, and alternatives.

Depending upon the embodiment, the thickened material can be subjected to impurities to form the solar cell structures. In a specific embodiment, the impurities can be in-situ doped, diffused, and/or implanted using ion beams, plasma immersion implantation, ion shower, non-mass separated implantation, substantially or partially non-mass separated, or conventional implantation techniques. These solar cell structures can include impurity regions for P-type and N-type impurities according to a specific embodiment. Of course, there can be other variations, modifications, and alternatives.

In a specific embodiment, the method can also form another layer overlying the thickened layer to form the photovoltaic devices. The other layer can be a semiconductor layer, which can be used to enhance the photovoltaic devices provided for the completed solar cell structure, according to a specific embodiment. In an alternative embodiment, the other layer can be germanium, silicon germanium, II/IV, III/V, SiC, GaN, any combination of these, and others. The other layer can be used to form another set of photovoltaic regions, which can be coupled to other photovoltaic devices, to enhance the total photovoltaic intensity. Of course, there can be other variations, modifications, and alternatives.

Depending upon the embodiment, the present method and structure can be formed with a specific thickness of the thickened layer and/or combination of the layer transferred layer and thickened layer. In a specific embodiment, the thickened layer can be between about 1 um and 20 um using a silicon material. In other embodiments, the thickened layer can be less than 1 micron or greater than 20 microns. In other embodiments, the thickened layer can be less than about 50 microns. Of course, there can be other variations, modifications, and alternatives.

Depending on the embodiments, it is to be understood that a specific thickness of material can either be formed using a first transferred layer that is subsequently thickened or can be transferred directly in a sufficient thickness that a further thickening step is not required. Other layers such as passivation layers, contact layers, diffusion layers, texturing and other light trapping layers, and light reflection or light coupling layers can also be added to the bottom substrate or donor before the joining step or on the top of the transferred film after the cleaving step. In a specific embodiment, the transferred layer can have a thickness ranging between about 1 um and 20 um using a silicon material. Of course, there can be other variations, modifications, and alternatives.

Figure 16:
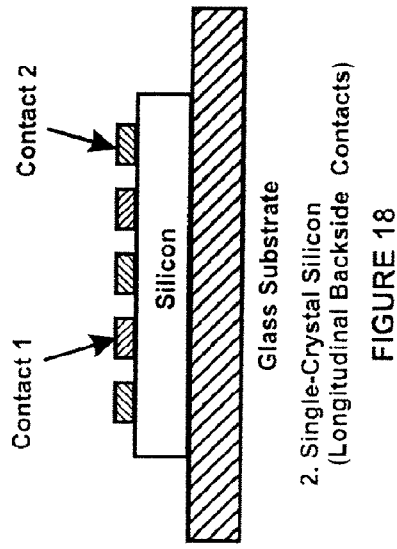
FIGS. 16 through 19 are simplified diagrams of solar cell configurations according to embodiments of present invention.

FIGS. 16 to 19 illustrate simplified diagrams of solar cell configurations according to embodiments of present invention. These diagrams are merely illustrations and should not unduly limit the scope of the claims herein. One of ordinary skill in the art would recognize many variations, modifications, and alternatives. As shown in FIG. 16, a first contact layer is formed sandwiched between a glass substrate and a first surface of a semiconductor layer. In a specific embodiment, the contact layer can be made of a suitable material such as a transparent conductive material, such as ITO and the like. Other materials can also be used. The first contact layer couples to a first electrode structure for a photovoltaic cell, which often comprises a p-n junction or multiple p-n junctions. As merely an example, the semiconductor layer may comprise material such as suitable single crystal silicon and others. A second contact layer is formed overlying a second surface of the semiconductor layer. The second contact layer is arranged in a direction parallel to the first contact layer. In a specific embodiment, the second contact layer is patterned to form a plurality of electrodes, which couple to each of the photovoltaic regions. Each of the electrodes can be configured in parallel and/or series depending upon the specific embodiment. Of course, there can be other variations, modifications, and alternatives.

Figure 17:
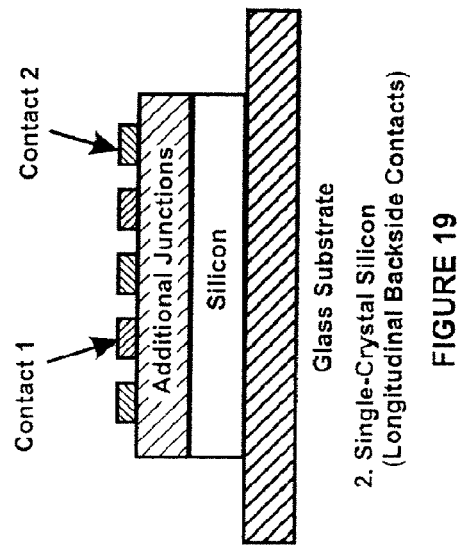

In a specific embodiment, additional junctions can be formed between the second contact layer and the semiconductor substrate to increase efficiency of a solar cell as shown by the simplified diagram of FIG. 17. As shown, the additional junctions are provided on a thickened layer overlying the thickness of single crystal silicon material according to a specific embodiment. The additional junctions can be separate from the photovoltaic devices in the thickness of single crystal silicon. Each of these additional junctions can be configured in parallel and/or series to each other and coupled to the photovoltaic devices in the thickness of silicon material. Alternatively, this structure may be formed using a directly transferred thickness of silicon material without a thickening step. Of course, there can be other variations, modifications, and alternatives.

Figure 18:
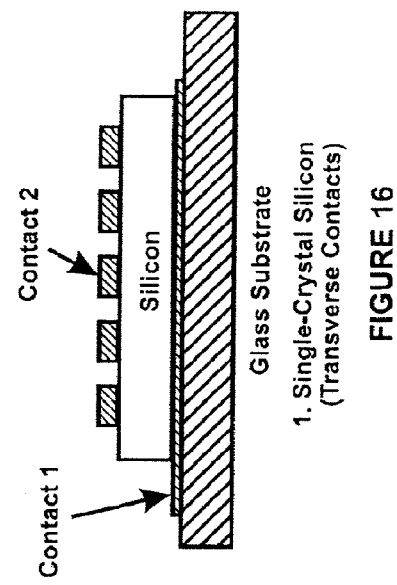
Figure 19:
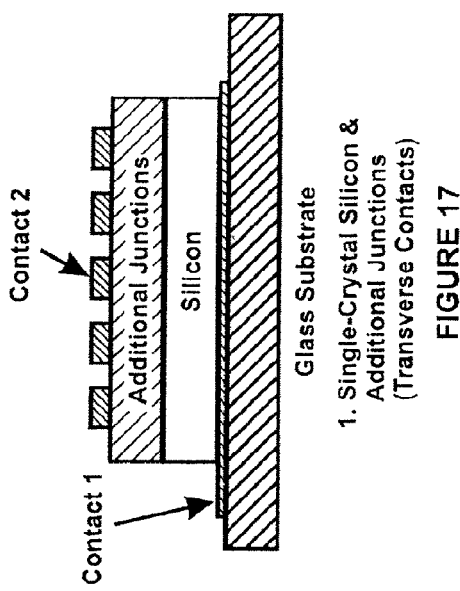

FIG. 18 illustrates yet another example of solar cell configuration according to an embodiment of the present invention. As shown, a glass substrate is attached to a first surface of a semiconductor layer. A first contact and a second contact are formed overlying a second surface of the semiconductor layer. The first contact structure is configured substantially parallel to the second contact structure. As shown, each of the photovoltaic devices is coupled to at least the first and second contact structures, which are overlying the thickness of single crystal silicon material. Alternatively, additional junctions can be formed between the contact structures and the semiconductor substrate to increase efficiency of the solar cell as shown FIG. 19. Of course there can be other variations, modifications, and alternatives.

Figure 20:
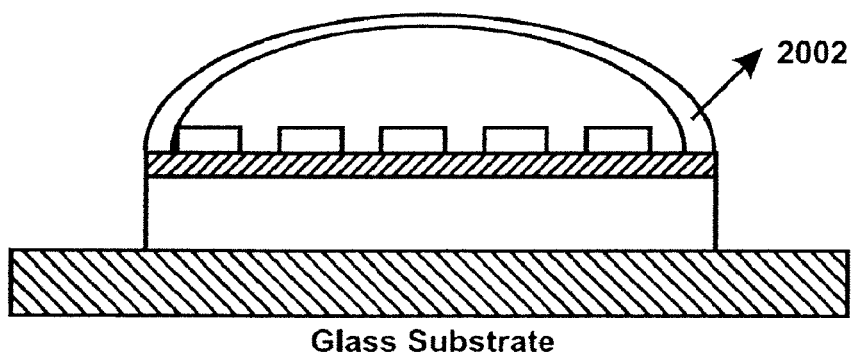
FIG. 20 is a simplified diagram of a solar cell having a reflective surface region according to an embodiment of the present invention.

FIG. 20 is a simplified diagram of a solar cell having a reflective surface region 2002 according to an embodiment of the present invention. As shown, a solar cell is provided. The solar cell includes a glass substrate attached to a first surface of a semiconductor layer. A plurality of contact structures are formed overlying a second surface of the semiconductor layer. As shown, each of the photovoltaic devices is coupled to at least the contact structure, which are overlying the thickness of single crystal silicon material. Light traverses through the glass substrate and the photovoltaic devices in the semiconductor layer and converts into electrical energy. As shown, reflective surface is provided to reflect any residual light that passes through the photovoltaic regions to further activate one or more of the photovoltaic devices and convert into electrical energy. The reflective surface can be provided using material such as aluminum, silver, gold, or other suitable reflective material. Alternatively, if a non-conductive reflector is desirable, a dielectric stack reflector can be designed alone or in combination with a conductive reflector. The reflective surface provides means for multiple passes of light in the photovoltaic device and increases efficiency of the solar cell. Of course there can be other variations, modifications, and alternatives.

Figure 21:
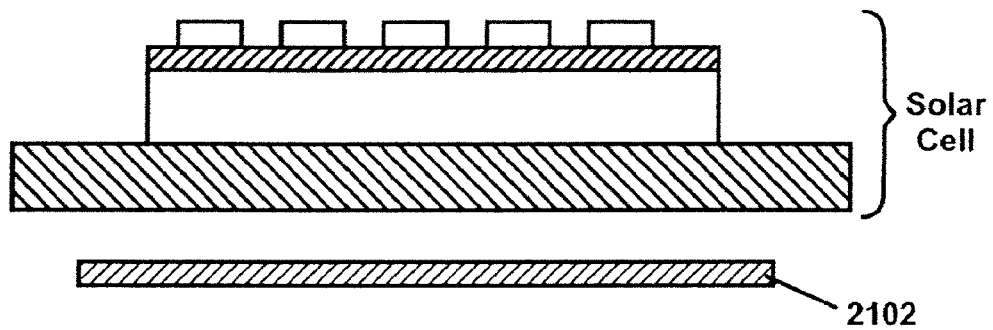
FIGS. 21 through 22 are simplified diagrams exemplifying solar cells having an optical region including a lens region according to an embodiment of the present invention.

FIG. 21 is a simplified diagram of a solar cell having a lens region 2102 according to an embodiment of the present invention. As shown, a solar cell is provided. The solar cell includes a glass substrate attached to a first surface of a semiconductor layer. A plurality of contact structures are formed overlying a second surface of the semiconductor layer. As shown, each of the photovoltaic devices is coupled to at least the contact structure, which are overlying the thickness of single crystal silicon material. Light traverses through the glass substrate and the photovoltaic devices in the semiconductor layer and converts into electrical energy. In a specific embodiment, light is redirected and/or scattered using an optical element 2001 coupled to the glass substrate to direct light in more oblique angles and increase collection efficiency of the solar cell. An example of such an optical element can be a Fresnel lens. The Fresnel lens can be made of a plastic material or glass material. Alternatively, the glass substrate can be modified to scatter or redirect light and function like a Fresnel lens. By modifying the shape of optical element 2001, the light trapping action can occur by total internal reflection as allowed by a waveguide effect within the silicon thin-film or by approximating a Lambertian source and thus increasing the effective thickness of the thin-film cell. Of course there can be other variations, modifications, and alternatives.

Figure 22:
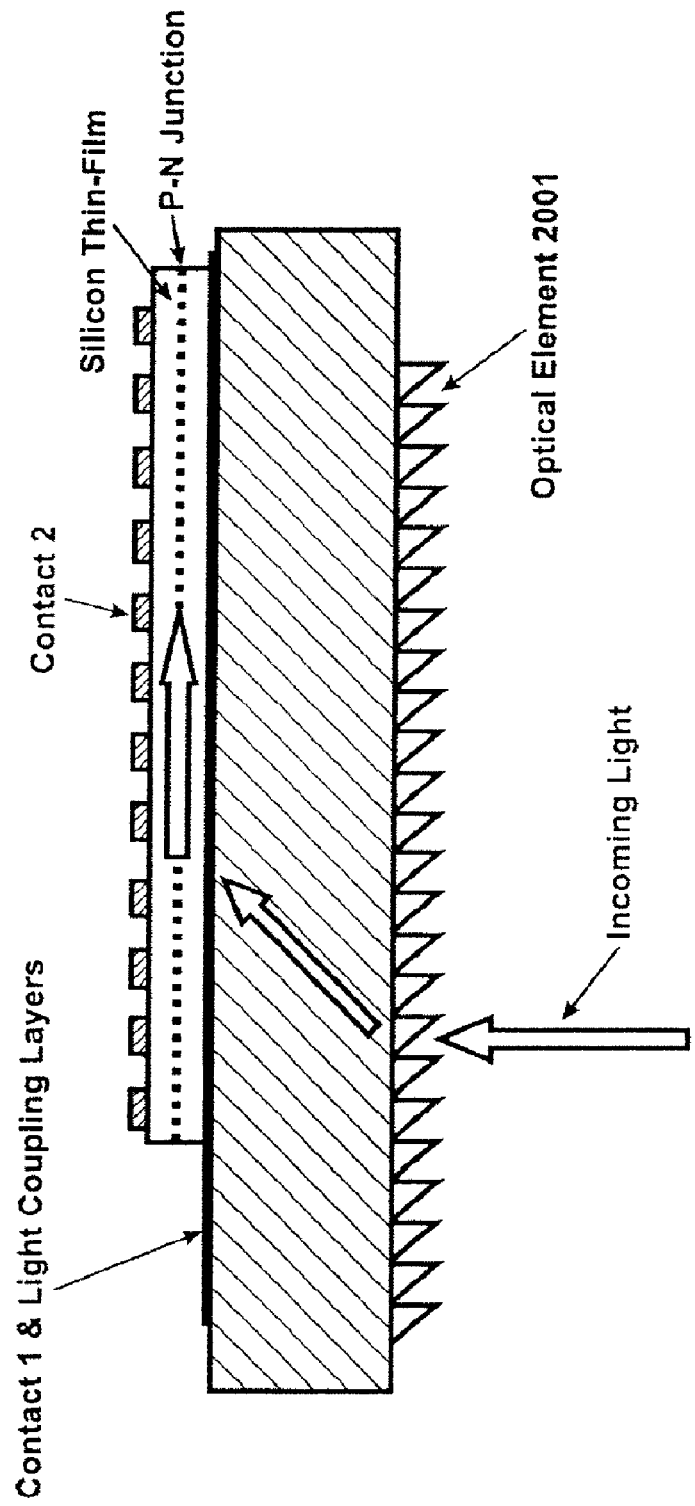

FIG. 22 shows a specific embodiment where an optical element is provided such that the mostly specular light rays are directed at an oblique angle towards a thin-film photovoltaic cell. This diagram is merely an example, which should not unduly limit the scope of the claims herein. One of ordinary skill in the art would recognize other variations, modifications, and alternatives. In a specific embodiment, the thickness of the thin-film is chosen such that the waveguide can not only trap the light impinging at the angle within the glass substrate but supports the propagation within the thin-film for the range of light wavelengths of interest. The design considerations are thus, for all wavelengths of interest (e.g., IR to near-UV which constitutes the largest solar power spectrum wavelength distribution), to allow propagation of transverse electric (TE), transverse magnetic (TM), and combination modes and higher order modes within the thickness of the thin-film cell to be allowed to propagate. A suitable dispersion curve for the waveguide to accomplish this design goal would generate the range of allowable silicon thicknesses and select the optical coupling layers that would act as the waveguide cladding. The entrance angle of the light within the transparent substrate would also be a design consideration for correct operation of the system throughout the range of cell entrance angles. Once coupled within the thin-film, the propagation will be highly attenuating due to the absorption of the radiation and its conversion to electricity by generating carriers within the thin-film. The longitudinal propagation of the light coincident with the longitudinal P-N junction would help maximizing light conversion efficiency. The resulting electric power would be collected by contacts 1 and 2. The structure also allows for light coupling layers that can help lower reflections that can lower the coupled light energy within the active area of the thin-film solar cell. In a specific embodiment, the wave guide can be operable in a multi-mode or single mode. Additionally, the wave can be made using an internal material to cause a difference in refractive index for internal reflection of incoming light according to a specific embodiment. In a preferred embodiment, a thin layer of silicon germanium can be sandwiched within a silicon structure to improve and even optimize light confinement to a region (e.g., central region) of one or more photovoltaic regions. Of course there can be other variations, modifications, and alternatives.

Figure 23:
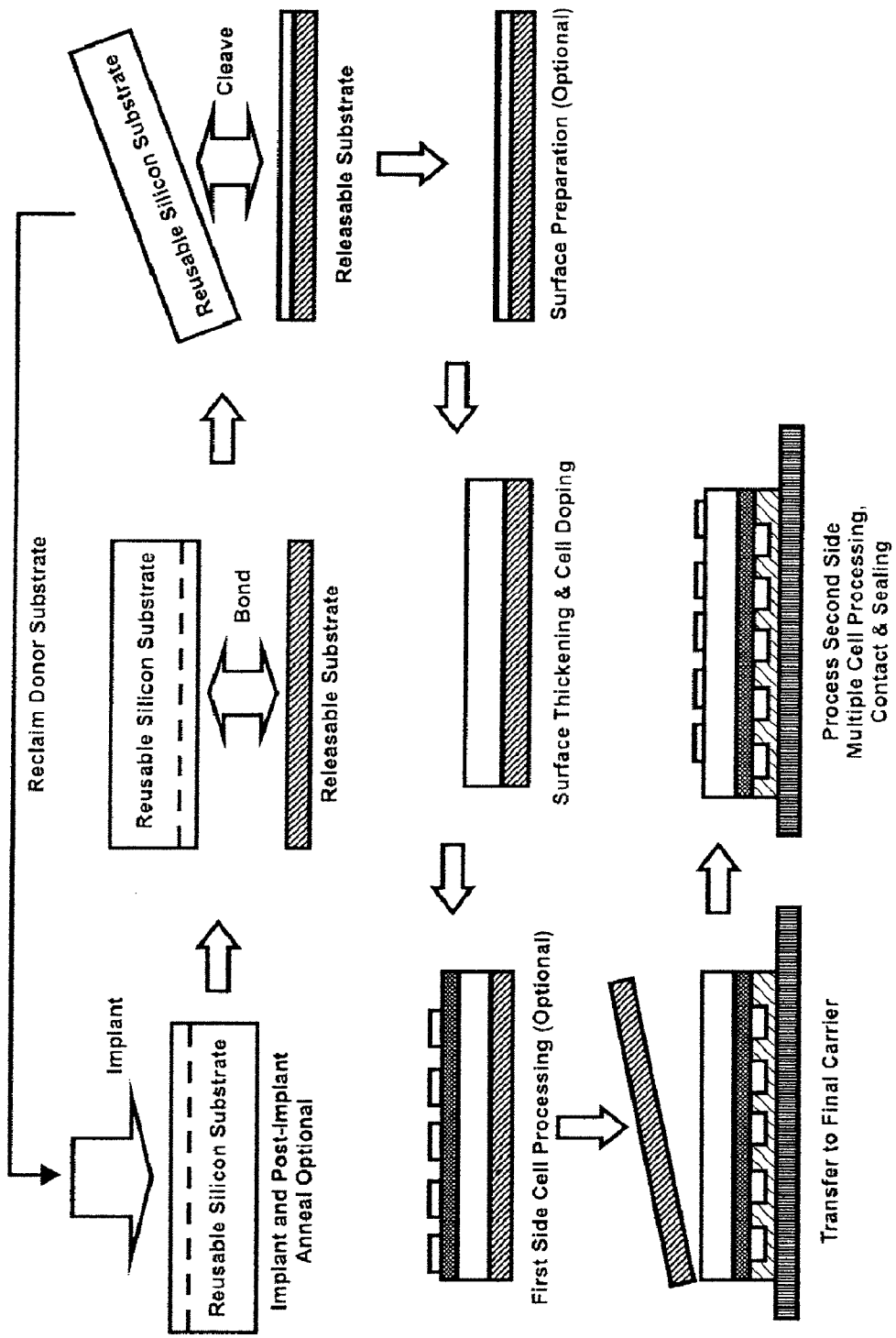
FIG. 23 illustrates a simplified process flow for forming a solar cell using a transferred growth template according to an embodiment of the present invention.
Figure 24:
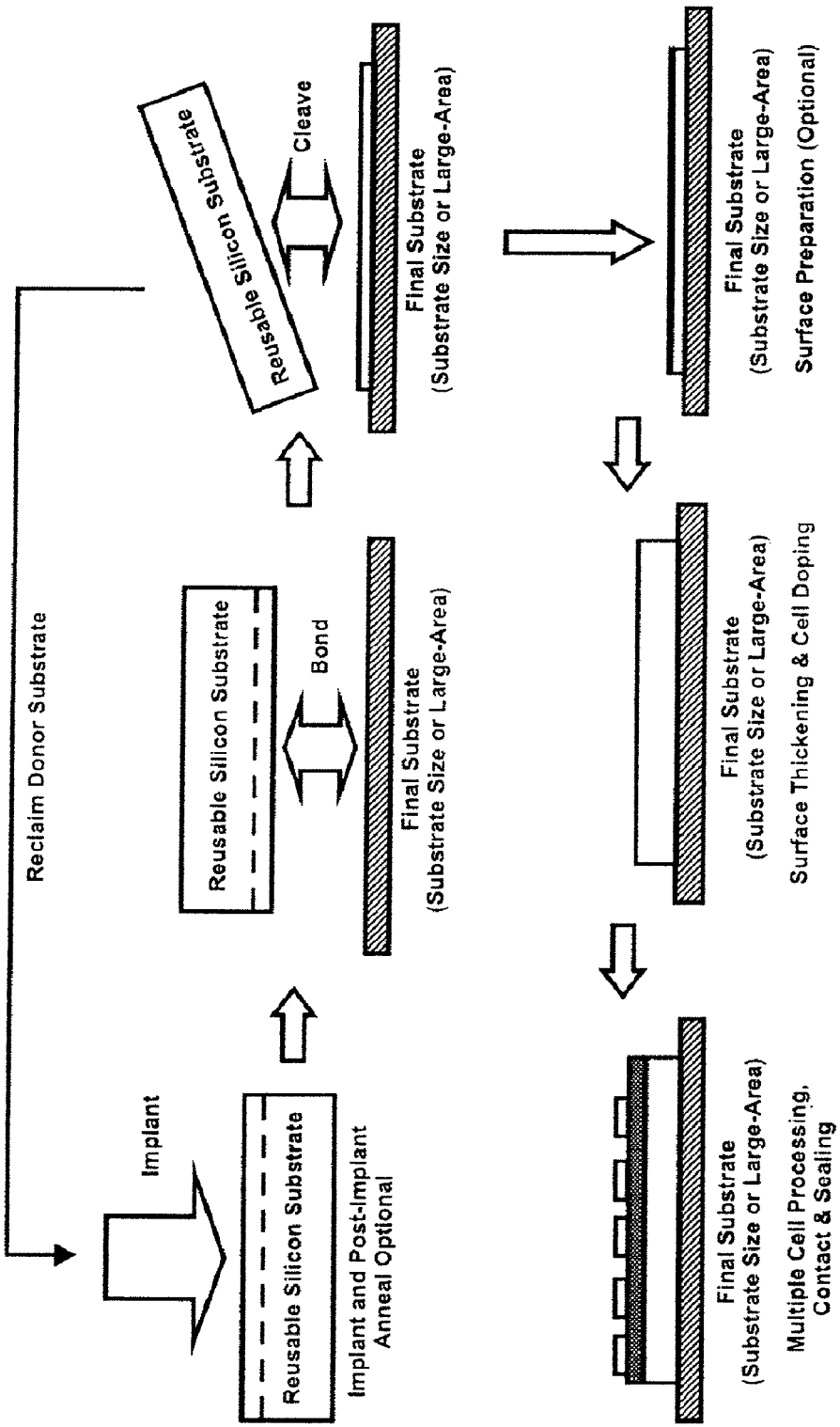
FIG. 24 illustrates a simplified process flow for forming a solar cell using a transferred growth template with subsequent silicon absorber layer thickening and doping according to an embodiment of the present invention.

FIG. 23-26 illustrate process flows for forming solar cells according to embodiments of the present invention. As shown, the process flows can be enabled by each of the three major energy ranges to form the thickness of film. FIG. 23-24 are related to the lower energy, growth template use of the transferred film after implant. FIG. 23 shows the use of a temporary, releasable substrate that would allow the process flow to have access to what will become the backside of the solar cell for layer doping, passivation and interconnect processing. Note that the temporary, releasable substrate can be implemented using numerous methods such as a chemically releasable substrate, for example, a thermally, mechanically or chemically releasable tape or rigid substrate, a vacuum chuck, or an electrostatic chuck. FIG. 24 is a simpler, direct transfer and growth process flow but would have less access to the backside for optimizing solar cell performance and its light conversion efficiency. Of course there can be other variations, modifications, and alternatives.

Figure 25:
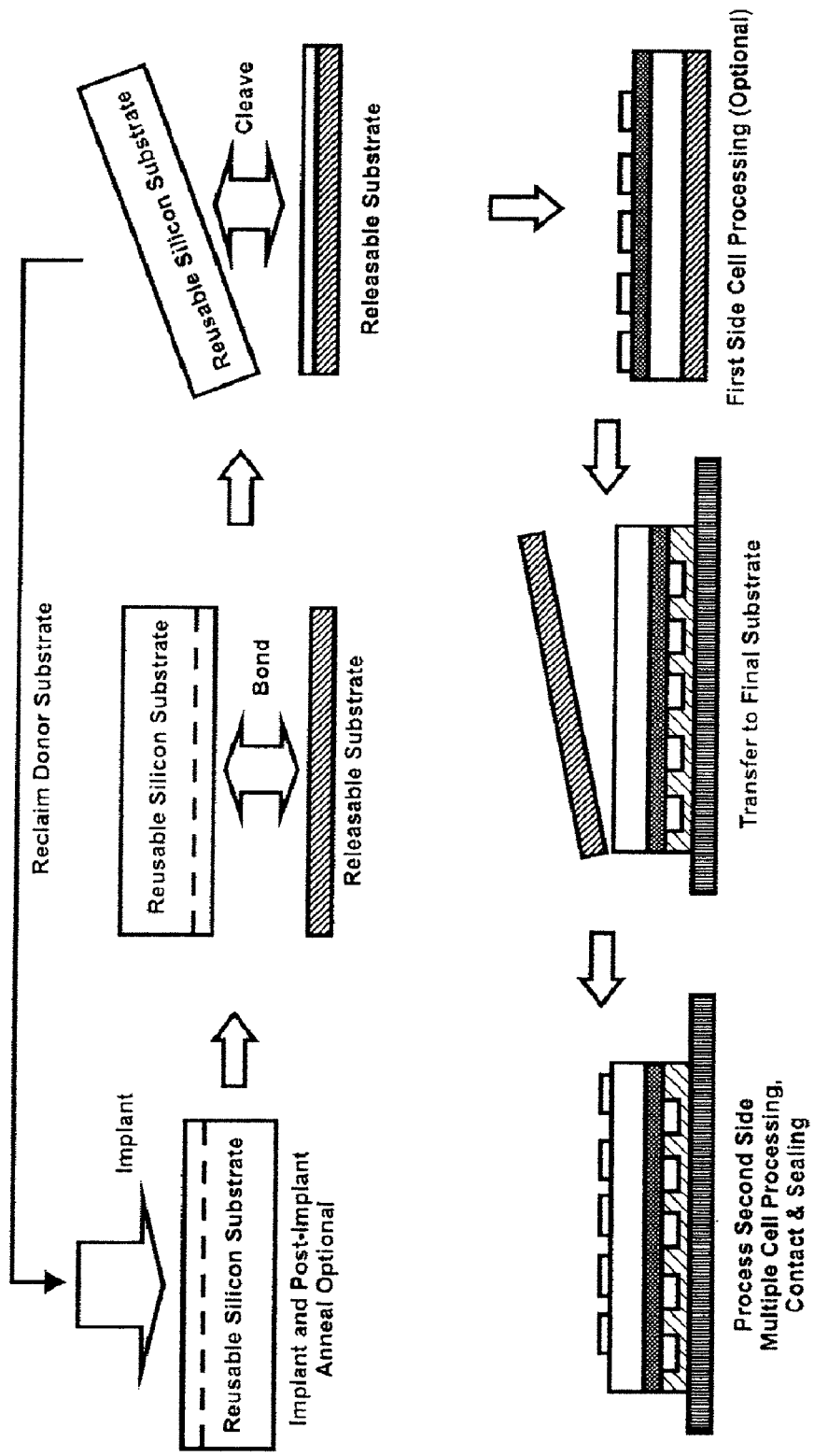
FIG. 25 illustrates a simplified process flow for forming a solar cell using transferring thin-film of silicon onto a reusable substrate to allow access to backside surface processing according to an embodiment of the present invention.
Figure 25A:
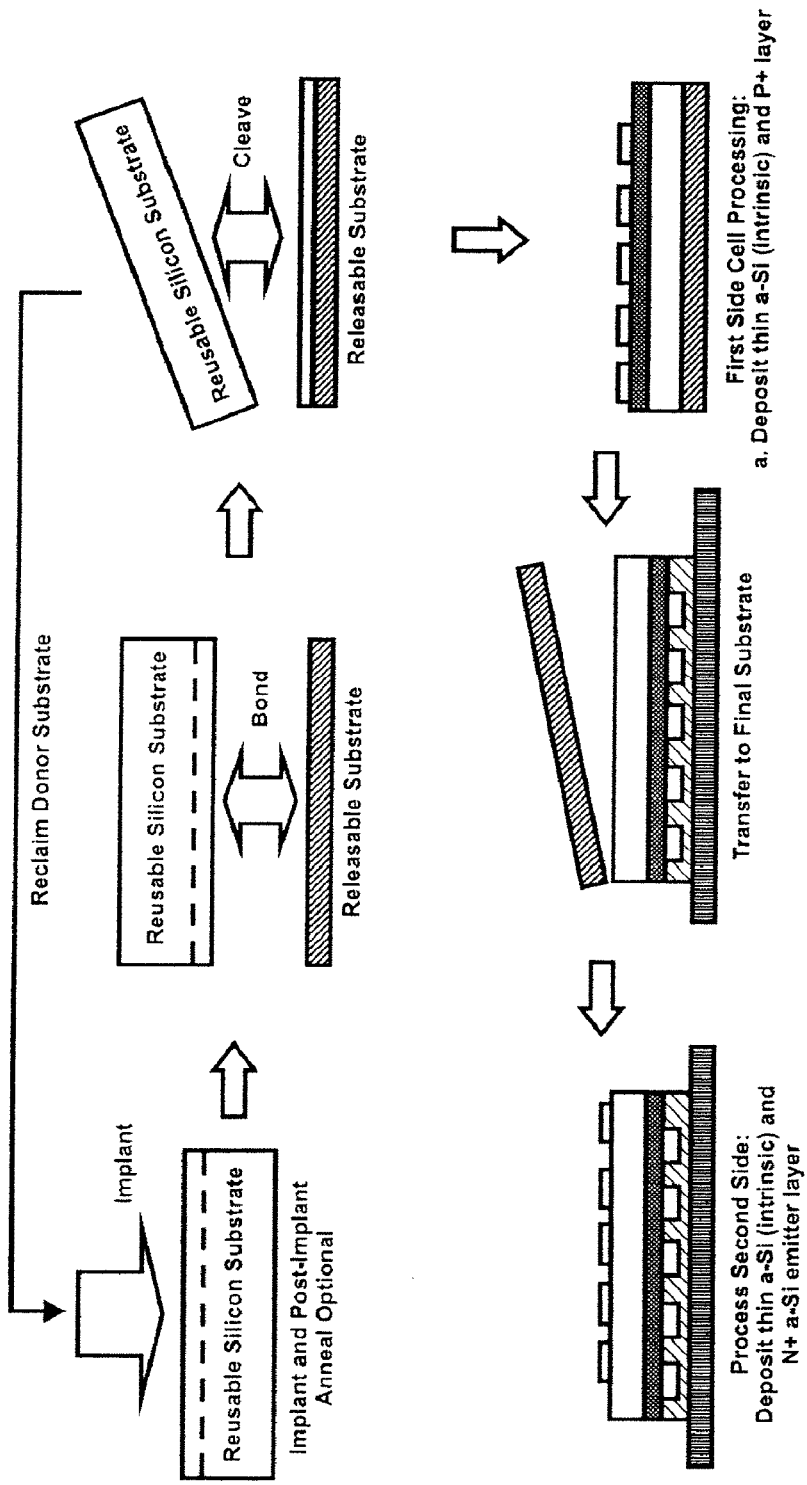
FIG. 25A illustrates a simplified process flow for fabricating a thin-film solar cell structure using a reusable temporary substrate according to an embodiment of the present invention.
Figure 26:
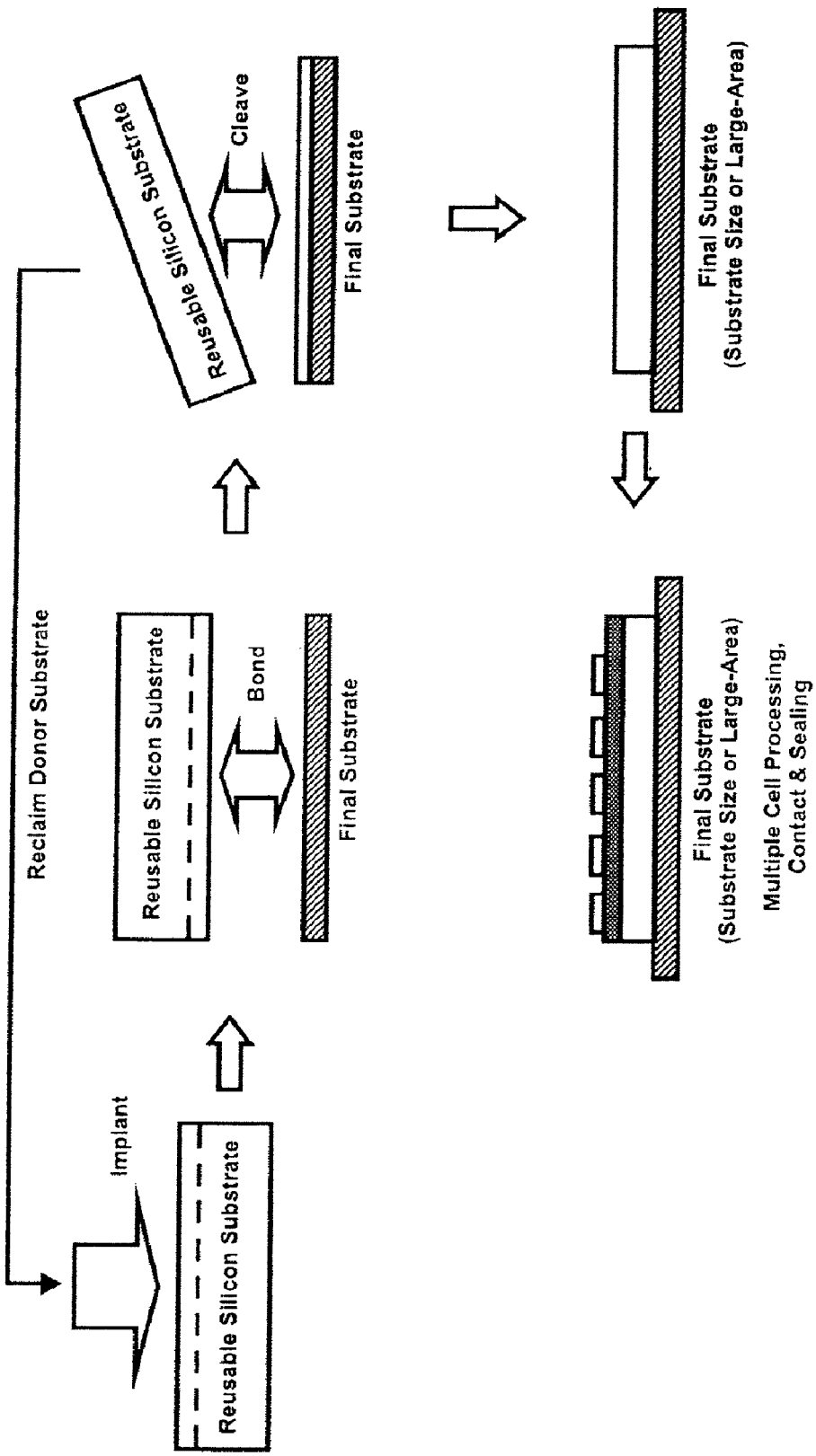
FIG. 26 illustrates a simplified process flow for forming a solar cell using a transferred thin-film of silicon onto a final substrate according to an embodiment of the present invention.

FIGS. 25 and 26 illustrate process flows using a temporary substrate and direct bonding for 1 um to 50 um films formed using an implant process. The major difference in these process flows compared to FIGS. 23 and 24 is the absence of a growth or thickening step. FIG. 25 shows the use of a temporary, releasable substrate that would allow the process flow to have access to what will become the backside of the solar cell for layer doping, passivation and interconnect processing. Note that the temporary, releasable substrate can be implemented using numerous methods such as a chemically releasable substrate such as a thermally, mechanically or chemically releasable tape or rigid substrate, a vacuum chuck, or an electrostatic chuck. FIG. 25A shows a specific example of the process flow described in FIG. 23 using an amorphous silicon contact and emitter structure. This amorphous (a-Si) thin surface layer has been shown to optimize the absorber passivation and allow better contacting. Since the thin-Si process of FIG. 25 utilizes a temporary substrate, backside access is possible for a-Si contact formation and passivation after the cleaving step. According to this example, the released silicon film having P to P– doping is deposited with a very thin amorphous intrinsic layer (10-30 Angstroms typically) that allows good surface passivation but also can allow current flow through tunneling. The a-Si layer is then doped P+ to serve as the backside contact. The layer is then bonded onto the final substrate. The back contacting can be contacted as shown or can be a continuous transparent or opaque conductive film depending on the specific embodiment. The front side is then passivated with a very thin intrinsic a-Si film and an emitter of N+ doped a-Si then serves as the second contact to the cell. This cell would function well as a high-efficiency cell. A tandem cell made of a-Si could also be deposited over this structure to further enhance efficiency. Of course, the doping or emitter surface choice can be reversed depending on the specific embodiment. FIG. 23 is of a simpler, direct transfer process flow but backside access would be only available prior to the bond step to the permanent substrate. There is therefore less opportunity for access to the backside for optimizing solar cell performance and its light conversion efficiency. The choice of the process flow can also be affected by the cost differences between high-temperature and low-temperature final substrates since the possible need of high-temperature cell processing steps made on the final substrate rather than on a temporary substrate may require a more expensive, high-temperature capable final substrate. Of course there can be other variations, modifications, and alternatives.

Figure 27:
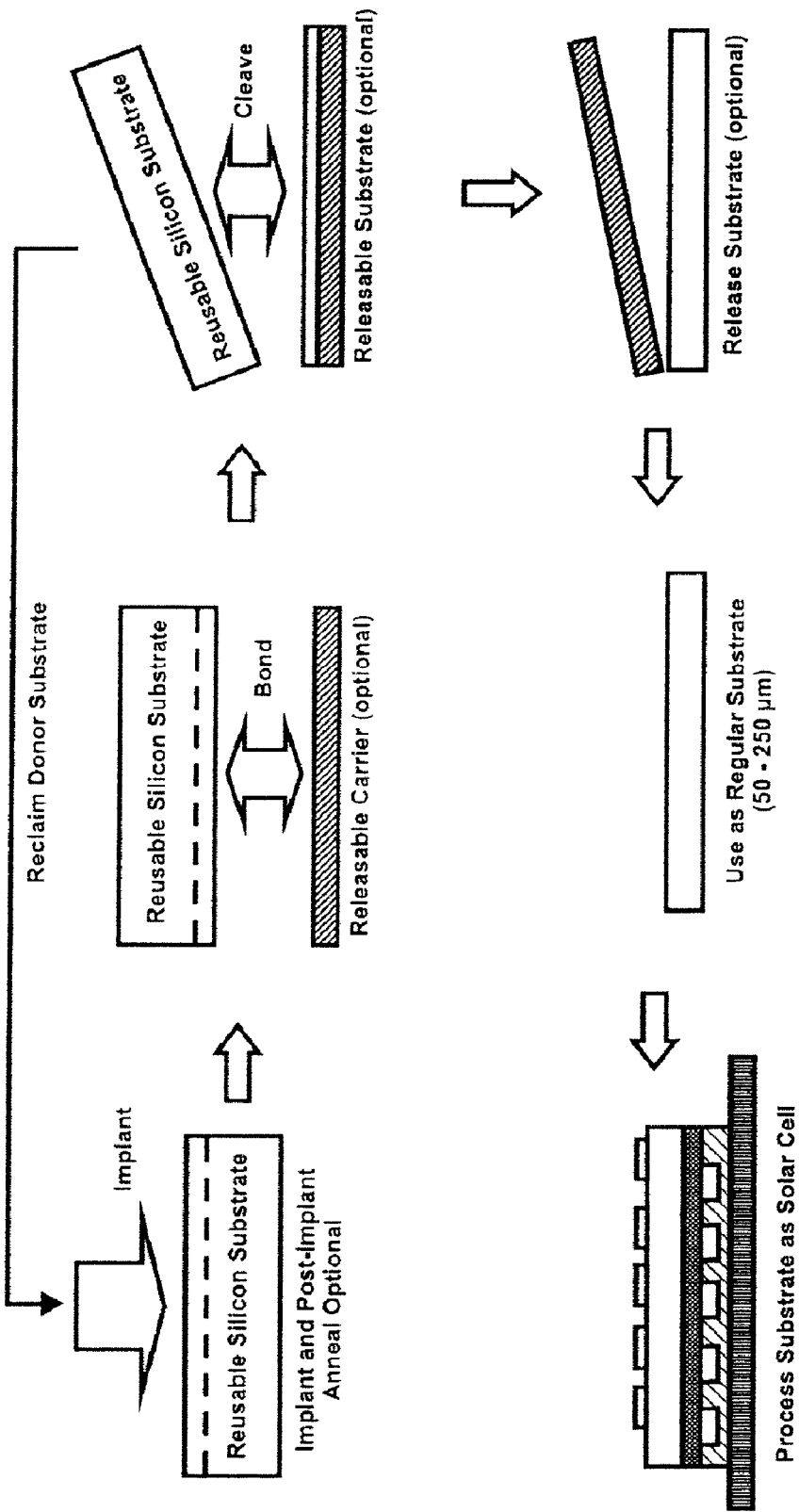
FIG. 27 illustrates a simplified process flow for forming a solar cell using a transferred film of silicon onto an optional temporary substrate or transferred directly to become a free standing substrate according to an embodiment of the present invention.

FIG. 27 illustrates a process flow of using a thick silicon film capable of being processed as a free standing substrate. Of about 50 um to 250 um in thickness, this thick-film can be either detached using a purely thermal process (which may be isothermal) by utilizing one or more of the controlled cleaving techniques mentioned above. The detachment can either be done directly as a free standing substrate, or transferred to a temporary, releasable substrate and eventually released for processing the side attached to this temporary substrate. Note that the temporary, releasable substrate can be implemented using numerous methods such as a chemically releasable substrate, for example, a thermally, mechanically or chemically releasable tape or rigid substrate, a vacuum chuck, or an electrostatic chuck. Of course there can be other variations, modifications, and alternatives.

In the above examples that do not include bonding or placement of a releasable substrate, a plate of appropriate hardness may be used during the cleaving process to confine any bending of the film away from its original shape, which might otherwise impart shear stresses that can cause undesired cleave plane branching, film breaks or direction changes. The plate can be in contact with the film, with no adhesive or other forms of attachment needed. Alternatively, the plate can be in close proximity to the film, as defined as a fraction of the film thickness being cleaved. The film would thus be contained to remain in essentially its original shape through the cleaving process.

If the cleaving process includes a thermal beam process using a laser beam for example, front surface access is required. In such a case, the plate can be made from a transparent material (Quartz, Sapphire, etc.). Optionally, this plate can also become the surface that can act as a carrier for the cleaved film if it has electrostatic or vacuum capability.

Any of the embodiments of methods or processes according to the present invention, including those specifically shown in FIGS. 23-27, may be performed in a continuous manner. Specifically, one or more reusable substrates in the form of one or a batch of bulk ingots or boules, may be subjected to repeated cycles of implantation, bonding (if appropriate), and cleaving steps, in order to produce the free standing or bonded material. Where methods and processes according to embodiments of the present invention are performed in such a continuous manner, the resulting high throughput can significantly reduce the cost of producing solar modules. Further discussion of such continuous processing, including disclosure of apparatuses suitable for performing same, may be found in co-pending U.S. Nonprovisional patent application Ser. No. 11/784,524, filed Apr. 5, 2007 and incorporated by reference in its entirety herein for all purposes.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. In certain embodiments, the backing substrate can be applied to each of the substrates, including handle and donor. In alternative embodiments, coatings may also be provided on surfaces or other regions of the transparent material. Therefore, the above description and illustrations should not be taken as limiting the scope of the present invention which is defined by the appended claims.

What is claimed is:

1. A method of forming a solar cell, the method comprising:
   providing a donor semiconductor substrate having a surface region, a cleave region, and a first thickness of material between the surface region and the cleave region;
   performing controlled cleaving by applying thermal energy to detach the first thickness of material from the donor semiconductor substrate;
   bonding the detached first thickness of material to a handle substrate; and
   incorporating the first thickness of material bonded to the handle substrate within the solar cell.

2. The method of claim 1 wherein the detached first thickness of material is free standing.

3. The method of claim 2 wherein the detached first thickness of material has a thickness of greater than about 20 um.

4. The method of claim 1 wherein the first thickness of material is bonded to a substrate prior to performing the controlled cleaving.

5. The method of claim 4 wherein the substrate is optically transparent.

6. The method of claim 4 wherein the first thickness of material is bonded to the handle substrate prior to performing the controlled cleaving.

7. The method of claim 4 wherein the first thickness of material is temporarily bonded to a releasable substrate prior to performing the controlled cleaving.

8. The method of claim 7 wherein the releasable substrate comprises a chemically releasable substrate or a thermally releasable substrate.

9. The method of claim 1 further comprising using a plate during the controlled cleaving to confine bending of the detached first thickness of material.

10. The method of claim 9 wherein the plate is transparent to the thermal energy.

11. The method of claim 9 wherein the plate is in contact with, or in close proximity to, the detached first thickness of material.

12. The method of claim 9 wherein the plate comprises a cold plate.

13. The method of claim 9 further comprising causing the plate to act as a carrier of the detached first thickness of material.

14. The method of claim 4 wherein the first thickness of material has a thickness of less than about 50 um.

15. The method of claim 1 wherein the thermal energy is applied from a flashlamp.

16. The method of claim 1 wherein the thermal energy is globally applied to the surface region.

17. The method of claim 1 wherein the thermal energy is locally applied to the surface region.

18. The method of claim 1 wherein the cleave region is defined by implantation of energetic particles into the semiconductor substrate.

19. The method of claim 18 wherein the implantation defines a patterned implant.

20. The method of claim 1 further comprising texturizing the handle substrate or providing the handle substrate with a texture to trap light.

21. The method of claim 1 further comprising coupling the first thickness of material to a contact structure.

22. The method of claim 21 wherein the contact structure is patterned to form a plurality of electrodes, the method further comprising forming a plurality of photovoltaic regions in the first thickness of material, the photovoltaic regions coupled to the plurality of electrodes.

23. The method of claim 21 further comprising coupling the first thickness of material to a second contact structure positioned on an opposite side of the first thickness of material from the contact structure.

24. The method of claim 1 wherein the thermal energy is applied from a thermal sink or source.

25. The method of claim 1 wherein the thermal energy is applied to the donor substrate.

26. The method of claim 1 wherein the thermal energy is applied to the handle substrate attached to the donor substrate.

* * * * *